(12) United States Patent
Wang et al.

(10) Patent No.: US 11,152,362 B2
(45) Date of Patent: Oct. 19, 2021

(54) FIN FIELD EFFECT TRANSISTOR (FINFET) DEVICE STRUCTURE

(71) Applicant: Taiwan Semiconductor Manufacturing Co., Ltd., Hsinchu (TW)

(72) Inventors: Chun-Chieh Wang, Kaohsiung (TW); Zheng-Yang Pan, Zhubei (TW); Yi-Min Huang, Tainan (TW); Shih-Chieh Chang, Taipei (TW); Tsung-Lin Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 147 days.

(21) Appl. No.: 15/348,652

(22) Filed: Nov. 10, 2016

(65) Prior Publication Data

US 2018/0130802 A1    May 10, 2018

(51) Int. Cl.
| | |
|---|---|
| H01L 27/092 | (2006.01) |
| H01L 29/06 | (2006.01) |
| H01L 29/165 | (2006.01) |
| H01L 29/423 | (2006.01) |
| H01L 29/78 | (2006.01) |
| H01L 21/8238 | (2006.01) |
| H01L 29/66 | (2006.01) |

(52) U.S. Cl.
CPC .. *H01L 27/0928* (2013.01); *H01L 21/823807* (2013.01); *H01L 21/823821* (2013.01); *H01L 27/0924* (2013.01); *H01L 29/0649* (2013.01); *H01L 29/165* (2013.01); *H01L 29/42364* (2013.01); *H01L 29/66818* (2013.01); *H01L 29/7851* (2013.01)

(58) Field of Classification Search
CPC ....... H01L 21/823821; H01L 29/66795; H01L 29/66545; H01L 21/823431; H01L 27/0924; H01L 29/785; H01L 27/0886
See application file for complete search history.

(56) References Cited

U.S. PATENT DOCUMENTS

| | | | |
|---|---|---|---|
| 7,425,740 | B2 | 9/2008 | Liu et al. |
| 8,048,723 | B2 | 11/2011 | Chang et al. |
| 8,053,299 | B2 | 11/2011 | Xu |
| 8,183,627 | B2 | 5/2012 | Currie |
| 8,415,718 | B2 | 4/2013 | Xu |
| 8,497,177 | B1 | 7/2013 | Chang et al. |
| 8,609,518 | B2 | 12/2013 | Wann et al. |

(Continued)

*Primary Examiner* — Marcos D. Pizarro
*Assistant Examiner* — Quinton A Brasfield
(74) *Attorney, Agent, or Firm* — Birch, Stewart, Kolasch & Birch, LLP

(57) ABSTRACT

A fin field effect transistor (FinFET) device structure and method for forming the same are provided. The FinFET device structure includes a fin structure extending above a substrate, and the fin structure has a first portion and a second portion below the first portion, and the first portion and the second portion are made of different materials. The FinFET device structure includes an isolation structure formed on the substrate, and an interface between the first portion and the second portion of the fin structure is above a top surface of the isolation structure. The FinFET device structure includes a liner layer formed on sidewalls of the second portion of the fin structure.

20 Claims, 20 Drawing Sheets

(56) References Cited

U.S. PATENT DOCUMENTS

| | | | |
|---|---|---|---|
| 8,618,556 B2 | 12/2013 | Wu et al. | |
| 8,633,516 B1* | 1/2014 | Wu | H01L 29/1054 |
| | | | 257/192 |
| 8,703,565 B2* | 4/2014 | Chang | H01L 29/7853 |
| | | | 438/283 |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 9,484,347 B1* | 11/2016 | Cheng | H01L 27/0922 |
| 2007/0111439 A1* | 5/2007 | Jung | H01L 21/84 |
| | | | 438/254 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2015/0097212 A1* | 4/2015 | Morin | H01L 29/0653 |
| | | | 257/192 |
| 2015/0263003 A1 | 9/2015 | Lee et al. | |
| 2016/0035827 A1* | 2/2016 | Diaz | H01L 29/0847 |
| | | | 257/506 |
| 2016/0379982 A1* | 12/2016 | You | H01L 29/0657 |
| | | | 257/369 |
| 2017/0047447 A1* | 2/2017 | Chiu | H01L 29/7851 |
| 2017/0062613 A1* | 3/2017 | Sung | H01L 29/7851 |
| 2017/0092728 A1* | 3/2017 | Kim | H01L 29/456 |

* cited by examiner

FIN FIELD EFFECT TRANSISTOR (FINFET) DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A is cross-sectional representation taken along I-I' line of FIG. 1A.

DETAILED DESCRIPTION

Figure 1A:
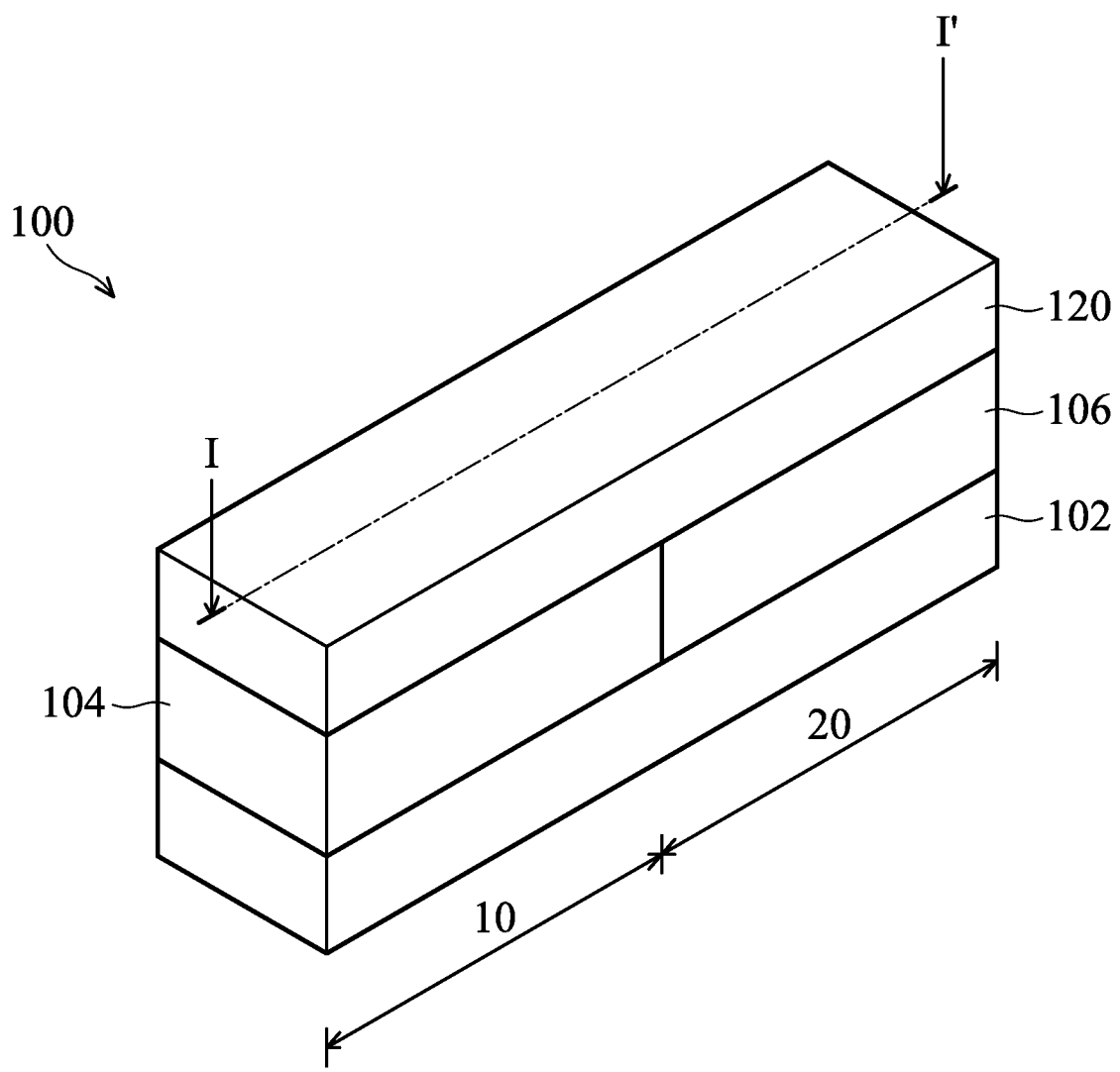
FIGS. 1A-1K show three-dimensional representations of forming a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIGS. 1A-1K show three-dimensional representations of forming a fin field effect transistor (FinFET) device structure 100, in accordance with some embodiments of the disclosure.

The FinFET device structure 100 includes a substrate 102. The substrate 102 includes a first region 10 and a second region 20. In some embodiments, a PMOS device is formed in the first region 10, and a NMOS device is formed in the second region 20. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A first well portion 104 is formed on the substrate 102 in the first region 10 and a second well portion 106 is formed on the substrate 102 in the second region 20. In some embodiments, first well portion 104 is a N-well portion, and the second well portion 106 is the P-well portion. A photoresist (not shown) is formed on the first region 10 of the substrate 102, and an ion implantation process is performed on the second region 20 to form the second well portion 106. A photoresist (not shown) is formed on the second region 20 of the substrate 102, and an ion implantation process is performed on the first region 10 to form the first well portion 104. In some embodiments, the first well portion 104 is doped with arsenic (As) or phosphorous (P) ions to form the N-well portion. In some embodiments, the second well portion 106 is doped with boron (B) ions to form the P-well portion.

Afterwards, a second material layer 120 is formed on the first well portion 104 and the second well portion 106. In some embodiments, the second material layer 120 is made of silicon (Si). In some embodiments, the second material layer 120 is grown on the first well portion 104 and the second well portion 106 by a chemical vapor deposition (CVD) process. The second material layer 120 made of silicon (Si) is formed by using silane ($SiH_4$), or disilane ($Si_2H_6$) as a source.

Figure 1B:
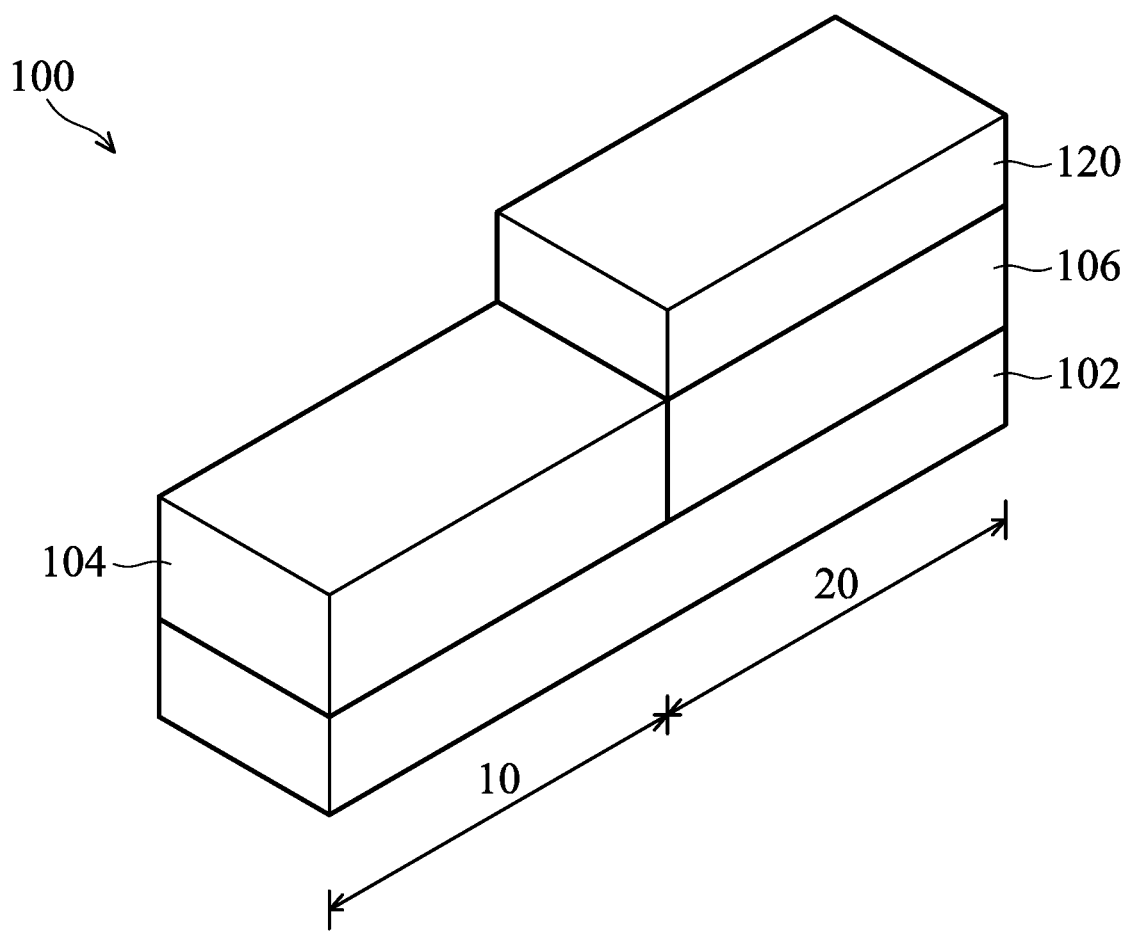

After the second material layer 120 is formed, a portion of the second material layer 120 is removed in the first region 10, as shown in FIG. 1B, in accordance with some embodiments of the disclosure. As a result, a top surface of the first well portion 104 is exposed. In some embodiments, the portion of the second material layer 120 is removed by etching process, such as wet etching process or dry etching process.

Figure 1C:
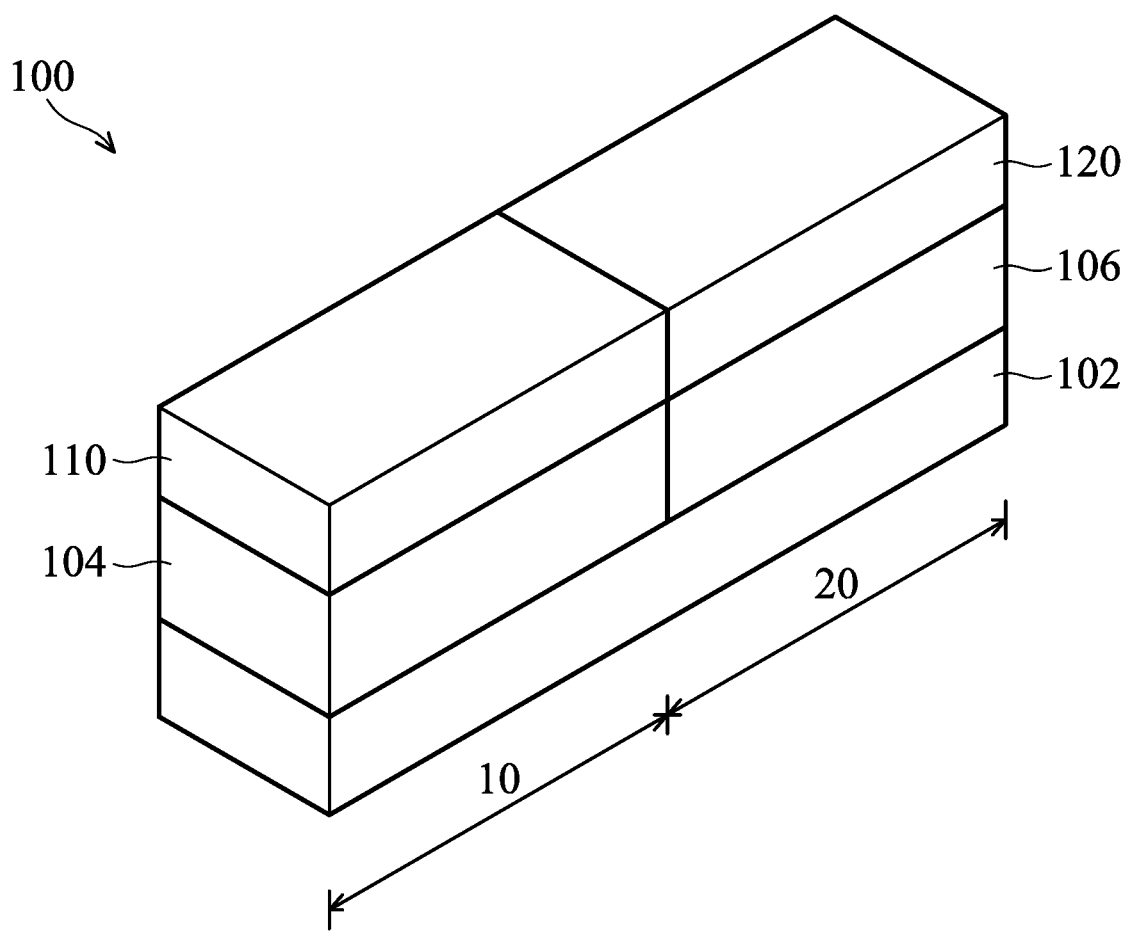

Afterwards, the first material layer 110 is formed on the first well portion 104, as shown in FIG. 1C, in accordance with some embodiments of the disclosure.

The first material layer 110 and the second material layer 120 are made of different materials. In some embodiments, the first material layer 110 is made of silicon germanium (SiGe), and the second material layer 120 is made of silicon (Si). In some embodiments, the silicon germanium (SiGe) includes a Ge concentration in a range from about 25% to about 50%. The silicon germanium (SiGe) in the first region 10 is used to be a channel region below a gate structure. The silicon germanium (SiGe) having a compressive strain is suitable for providing increased carrier speed, i.e., increased hole carrier speed, for the channel region of P-type FinFET (PMOS device). The strained silicon (Si) material having intrinsic tensile strain is suitable for the channel region of N-type FinFET (NMOS device).

In some embodiments, the first material layer 110 is formed by a chemical vapor deposition (CVD) process. The first material layer 110 made of silicon germanium (SiGe) is formed by using silane ($SiH_4$) or disilane ($Si_2H_6$), and germanium ($GeH_4$) as reactants.

Afterwards, an oxide layer 122 is formed on the first material 110 and the second material 120. In some embodiments, the oxide layer 122 is made of silicon oxide. The oxide layer 122 is formed by deposition processes, such as a chemical vapor deposition (CVD) process, a high-density plasma chemical vapor deposition (HDPCVD) process, a spin-on process, a sputtering process, or another applicable process.

A hard mask layer 124 is formed on the oxide layer 122. The hard mask 124 may be made of silicon oxide, silicon nitride, silicon oxynitride, or another applicable material. In some other embodiments, more than one hard mask layer 124 is formed on the oxide layer 122. The hard mask layer 124 is formed by deposition processes, such as a chemical vapor deposition (CVD) process, a high-density plasma chemical vapor deposition (HDPCVD) process, a spin-on process, a sputtering process, or another applicable process.

Figure 1D:
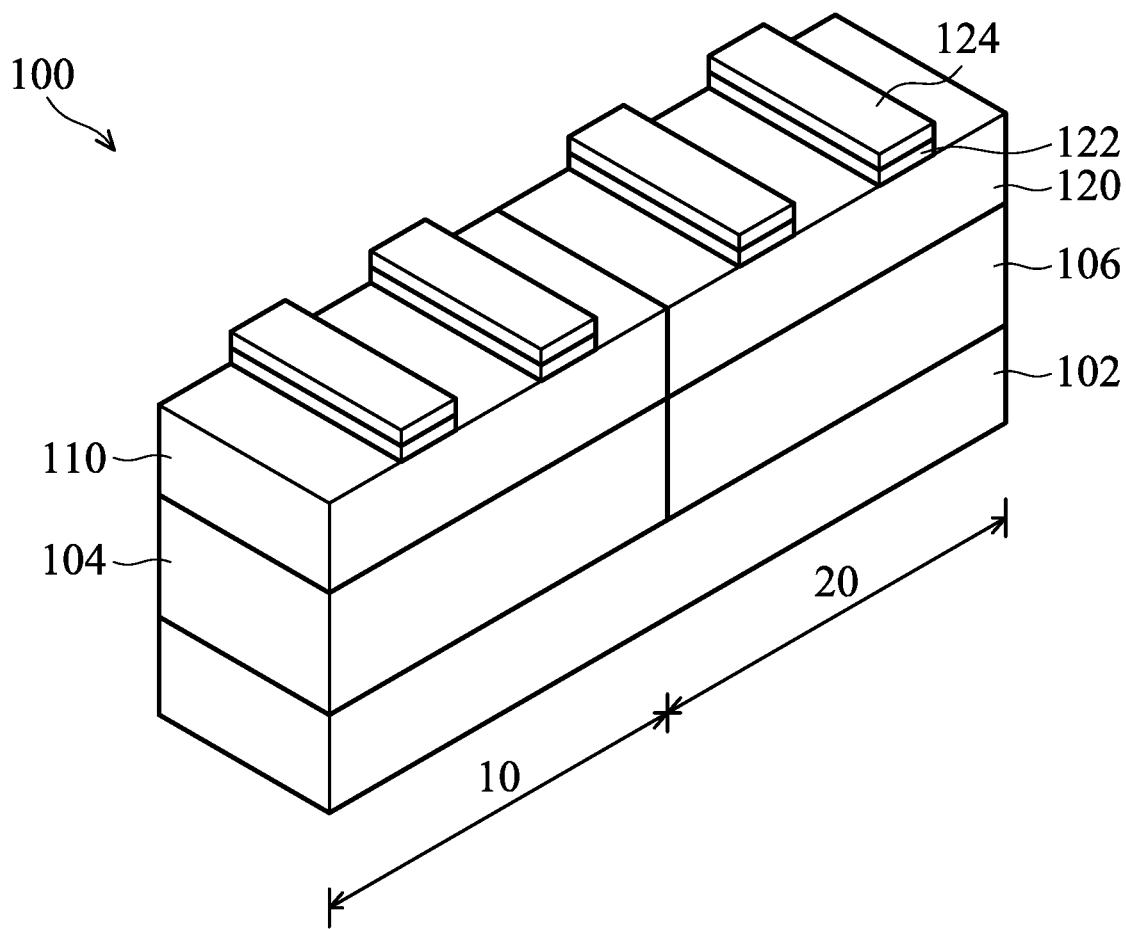
Figure 1E:
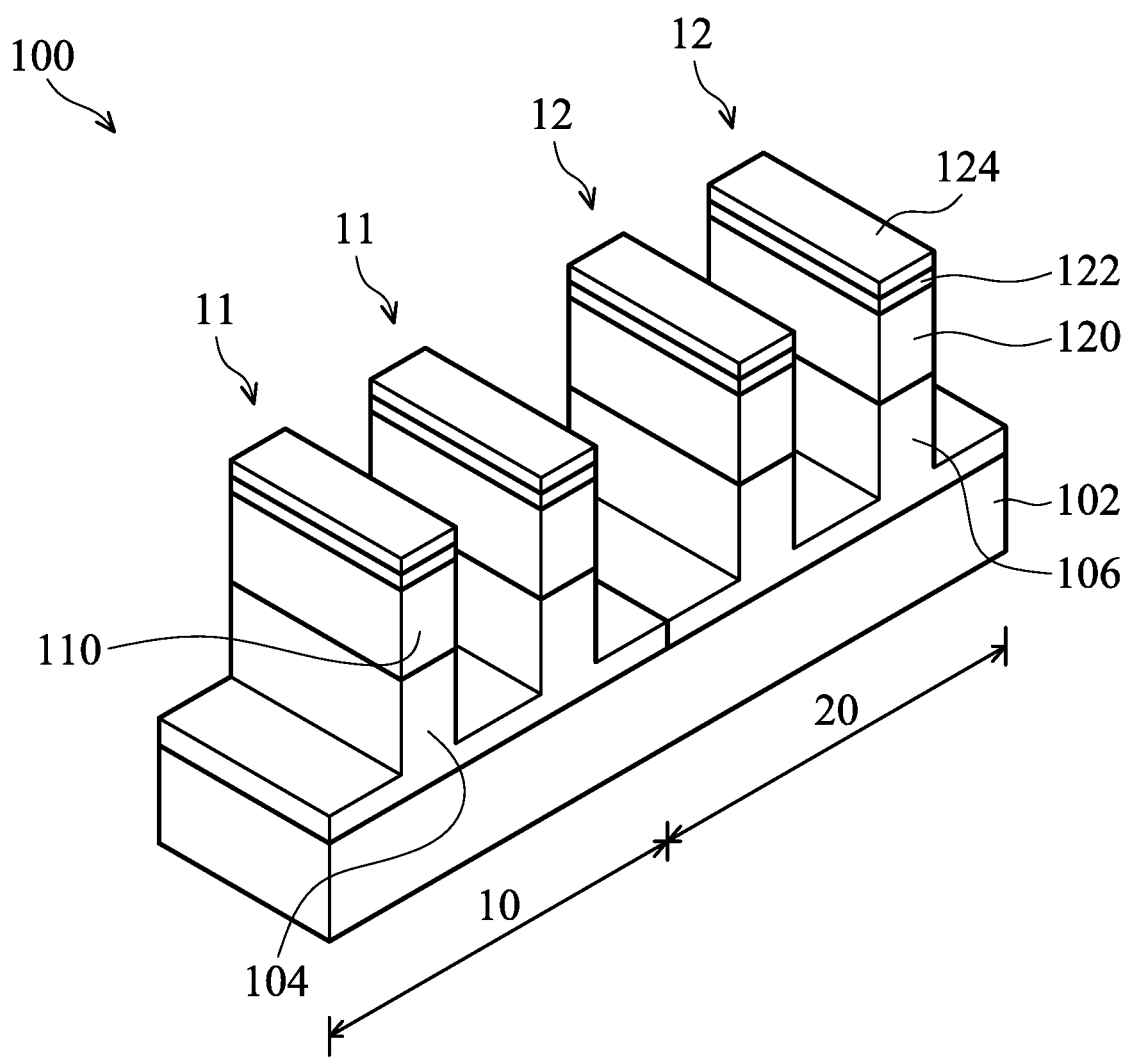

The oxide layer 122 and the hard mask layer 124 are patterned by a patterning process to form a patterned oxide layer 122 and a patterned hard mask layer 124, as shown in FIG. 1D, in accordance with some embodiments of the disclosure. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process Afterwards, an etching process is performed on the first material layer 110, the first well portion 104, the second material layer 120 and the second well portion 106 to form a first fin structure 11 and a second fin structure 12, as shown in FIG. 1E, in accordance with some embodiments of the disclosure. The first fin structure 11 and the second fin structure 12 are formed by using the patterned oxide layer 122 and the patterned hard mask layer 124 as a mask. The etching process may be a dry etching process or a wet etching process.

The first fin structure 11 includes a first portion and a second portion below the first portion. The first portion is made of first material layer 110, and the second portion is made of the first well portion 104. The second fin structure 12 includes a first portion and a second portion below the first portion. The first portion is made of second material layer 120, and the second portion is made of the second well portion 106.

It should be noted that the number of first fin structures 11 and the number of second fin structures 12 may be adjusted according to actual application, and it is not limited to two first fin structures 11 in the first region 10 and two second fin structures 12 in the second region 20.

Figure 1F:
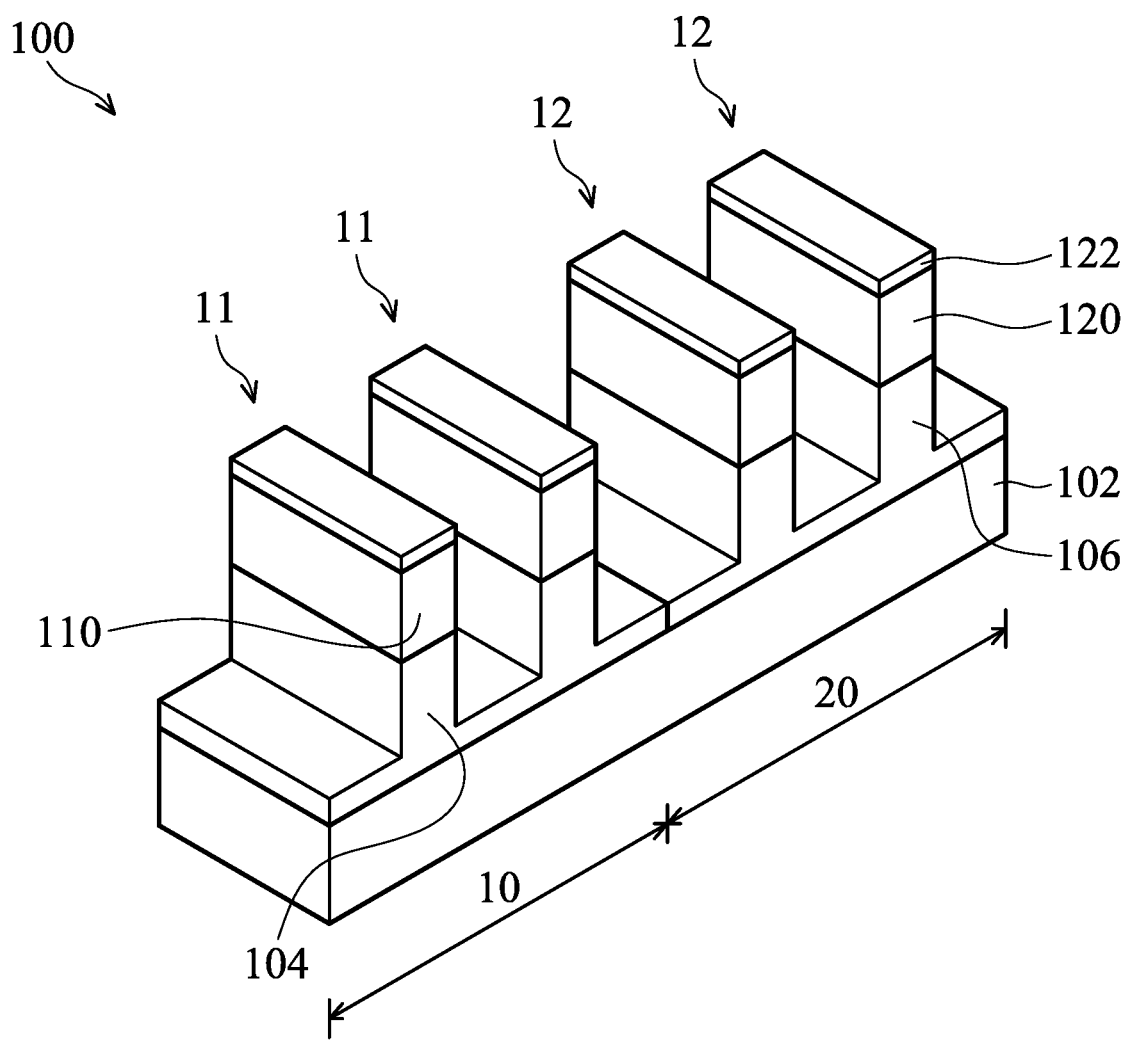

Afterwards, the patterned hard mask layer 124 is removed, as shown in FIG. 1F, in accordance with some embodiments of the disclosure. The patterned hard mask layer 124 is removed by an etching process.

Figure 1G:
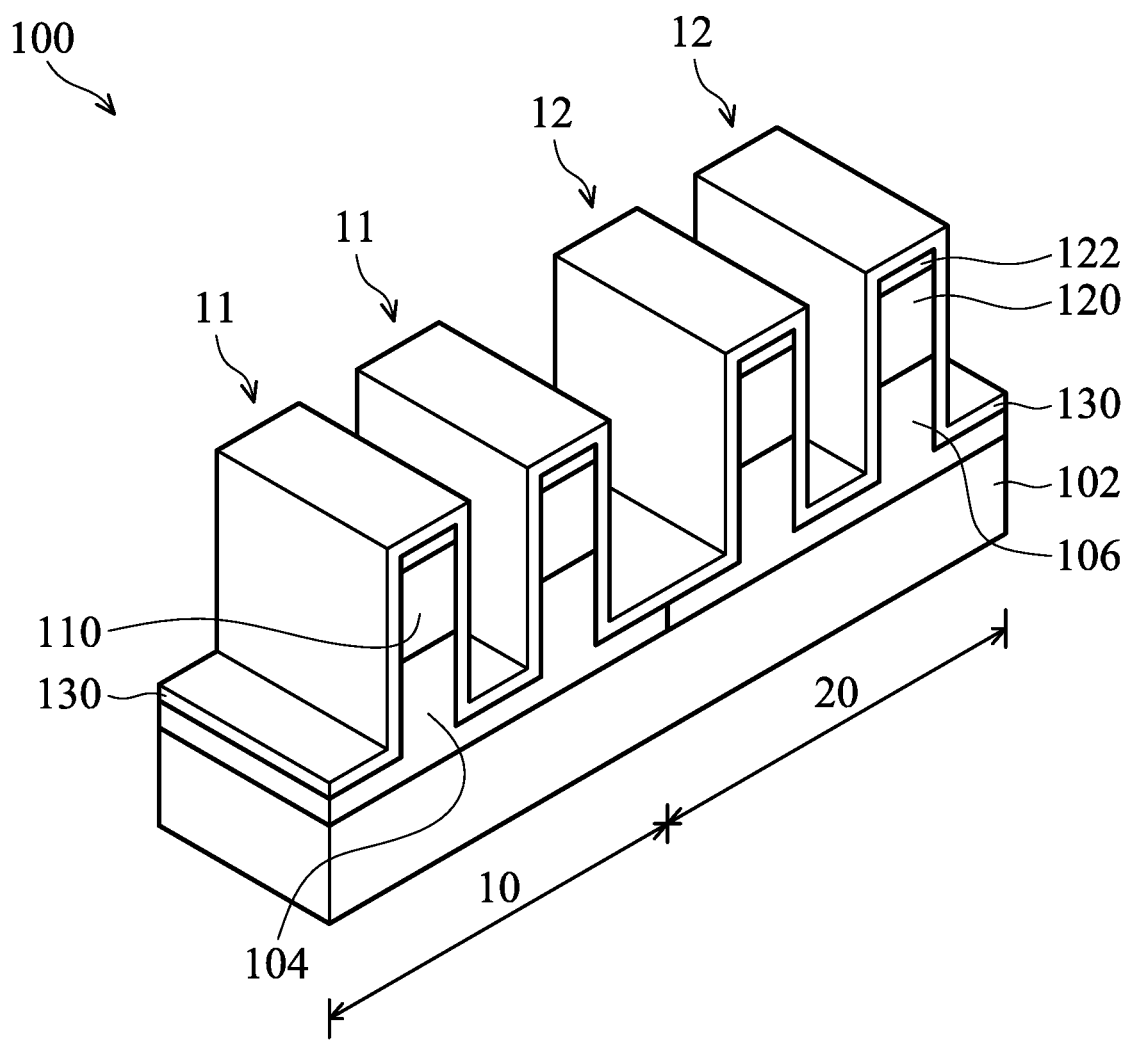

After the patterned hard mask layer 124 is removed, a liner layer 130 is formed on the first fin structure 11 and the second fin structure 12, as shown in FIG. 1G, in accordance with some embodiments of the disclosure. More specifically, the liner layer 130 is conformally formed on the sidewalls, top surface of first fin structure 11 and the second fin structure 12, and on the first material layer 104 and the second material layer 106.

The liner layer 130 is used to protect the first fin structure 11 and the second fin structure 12 from being damaged by the following processes (such as an anneal process or an etching process). Therefore, the profiles or shapes of the first fin structure 11 and the second fin structure 12 are maintained or preserved by the protection of the liner layer 130. In order to protect the underlying first fin structure 11 and the second fin structure 12, the liner layer 130 has a Young's modulus in a range from about 200 GPa to about 1000 GPa. When the Young's modulus of the liner layer 130 is within the above-mentioned range, the liner layer 130 is robust or rigid enough to protect the underlying structures. The liner layer 130 is made of nitrogen-containing material, carbon-containing material or combinations thereof. In some embodiments, the liner layer 130 is made of silicon nitride, silicon carbide (SiC), silicon oxynitride, silicon oxycarbide (SiOC) or combinations thereof.

In some embodiments, the liner layer 130 has a dielectric constant in a range from about 0 to about 10. When the dielectric constant of the liner layer 130 is within the above-mentioned range, the parasitic capacitance will be reduced.

In some embodiments, the liner layer 130 is not made of oxide, such as silicon oxide. If the liner layer 130 made of silicon oxide, the liner layer 130 is not robust enough to protect the first fin structure 11 and the second fin structure 12, especially when the fin structure includes silicon germanium (SiGe). When the first material layer 110 is made of silicon germanium (SiGe), silicon germanium (SiGe) is easily oxidized to form germanium oxide (GeOx) during the subsequent annealing process. Once the germanium oxide (GeOx) is formed, it is easily removed by the etching process. Therefore, the profiles or shape of the fin structure will be changed. In addition, the germanium (Ge) concentration will be reduced due to the oxidation reaction.

Figure 1H:
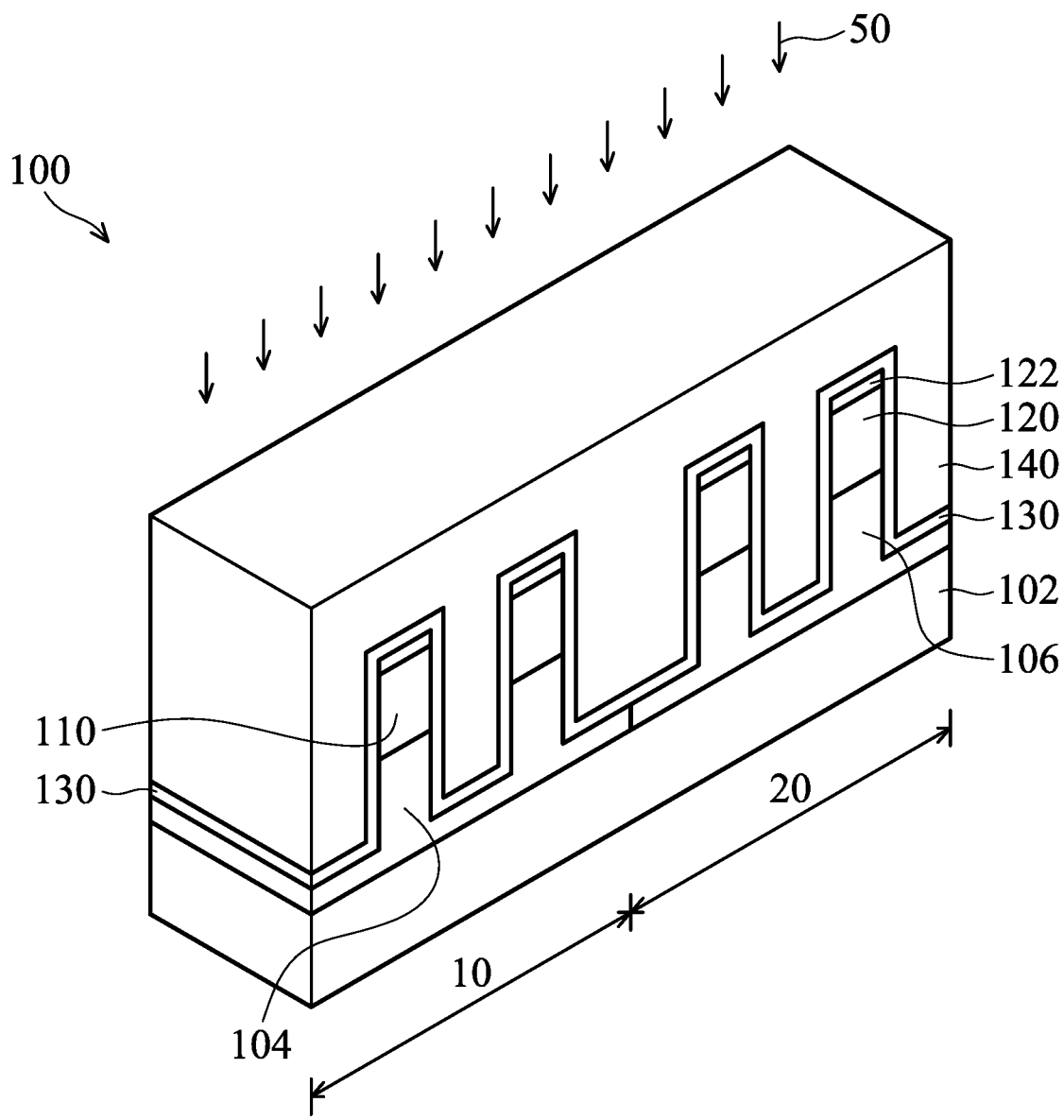

After the liner layer 130 is formed, a dielectric layer 140 is formed on the liner layer 130, as shown in FIG. 1H, in accordance with some embodiments. In some embodiments, a dielectric material is deposited on the first fin structure 11, the second fin structure 12 and the liner layer 130, and afterwards an anneal process 50 is performed on the dielectric material. During the anneal process 50, the dielectric material is transformed from liquid form into solid form to form the dielectric layer 140. In some embodiments, a rapid thermal annealing (RTA) process is performed on the dielectric material.

The dielectric layer 140 may be made of one or more dielectric materials, such as silicon oxide, silicon nitride, low-k dielectric materials. The dielectric layer 140 may be deposited by a chemical vapor deposition (CVD) process, a spin-on-glass process, or another applicable process.

Figure 1I:
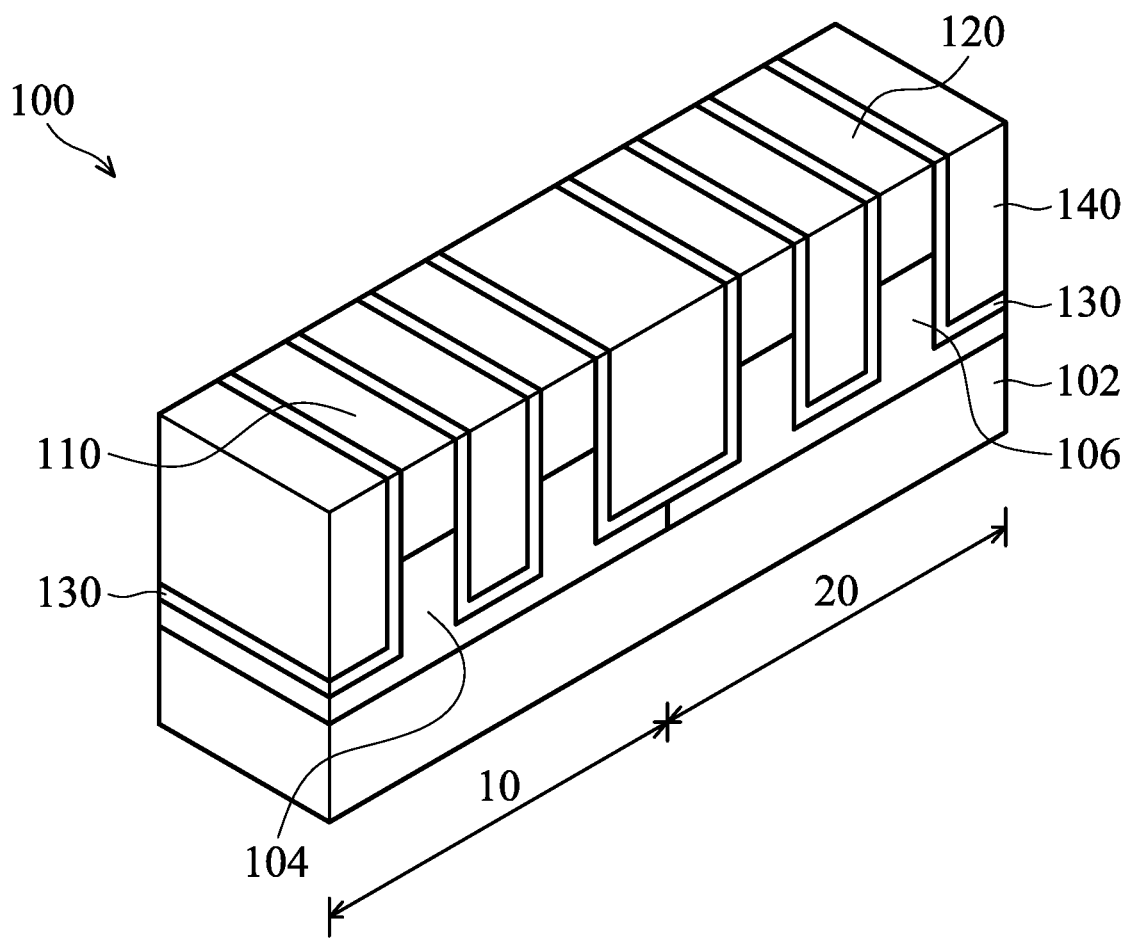

After the dielectric layer 140 is formed on the liner layer 130, the dielectric layer 140 is thinned or planarized until a top surface of the dielectric layer 140 is level with a top surface of the first material layer 110 and a top surface of the second material layer 120 as shown in FIG. 1I, in accordance with some embodiments. In addition, the oxide layer 122 is removed. In some embodiments, the dielectric layer 208 is thinned by a chemical mechanical polishing (CMP) process.

Figure 1J:
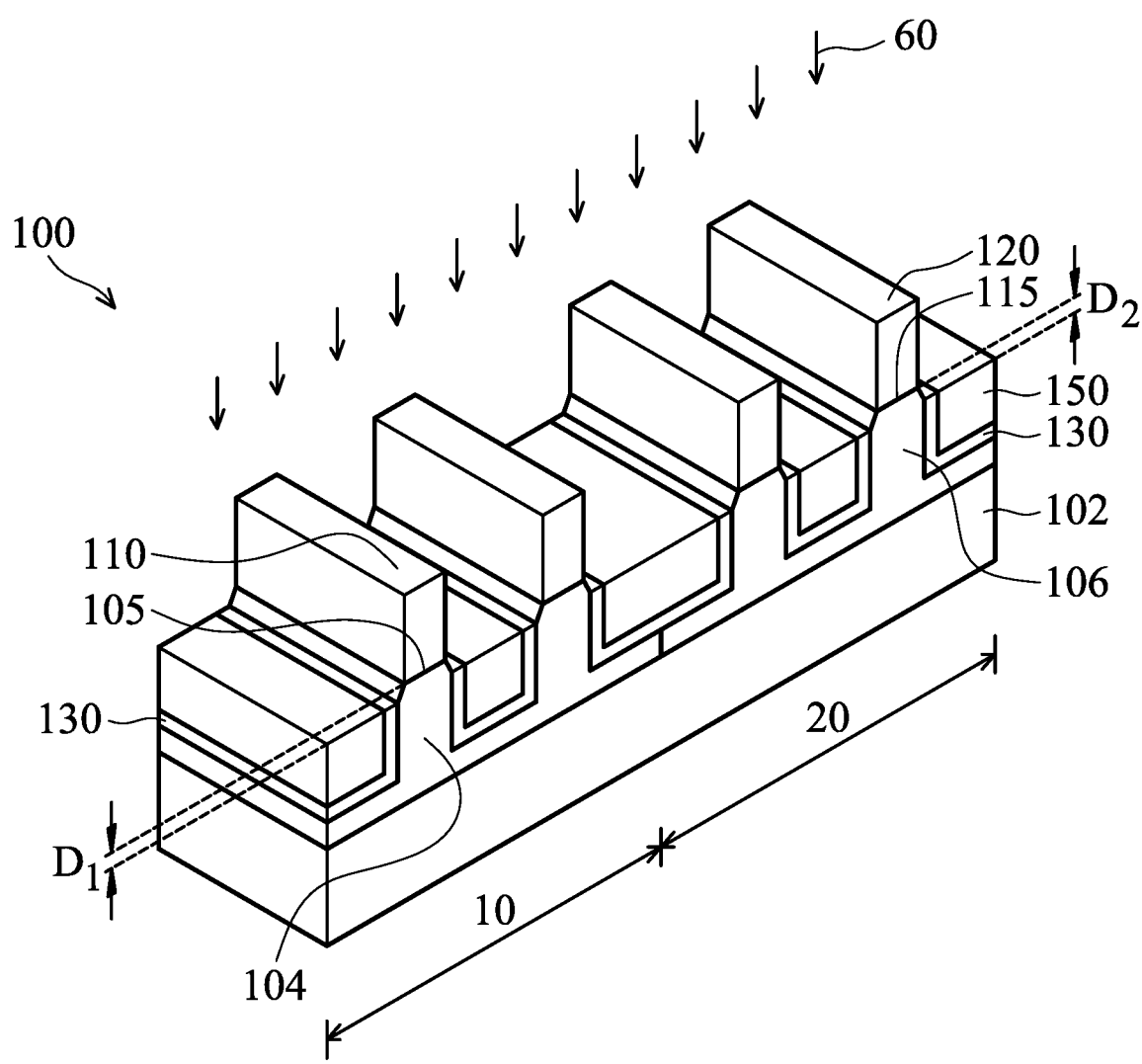

Afterwards, a portion of the dielectric layer 140 and a portion of the liner layer 130 are removed to expose the first material layer 110 in the first region 10 and the second material layer 120 in the second region 20 as shown in FIG. 1J, in accordance with some embodiments. As a result, an isolation structure 150 is formed. The dielectric layer 140 is removed by an etching process 60, such as a dry etching process or a wet etching process.

A first interface 105 between the first well portion 104 and the first material layer 110 is higher than a top surface of the isolation structure 150. A second interface 115 between the second well portion 106 and the second material layer 120 is higher than the top surface of the isolation structure 150. The first material layer 110 and a portion of the first well portion 104 protrude from the isolation structure 150. The second material layer 120 and a portion of the second well portion 106 protrude from the isolation structure 150.

The liner layer 130 is formed on sidewalls of the first well portion 104 and the sidewalls of the second well portion 106. The liner layer 130 is extended from the sidewalls of the first well portion 104 to the sidewalls of the second well portion 106. Therefore, the isolation structure 150 is surrounded by the liner layer 130.

In some embodiments, the first material layer 110 is slightly removed by the etching process 60, and therefore the width of the first material layer 110 is smaller than the width of the first well portion 104. In some embodiments, the second material layer 120 is slightly removed by the etching process, and therefore the width of the second material layer 120 is smaller than the width of the second well portion 106. In addition, a portion of the top portion of the first well portion 104 is removed, and a portion of the top portion of the second well portion 106 is removed. Therefore, the exposed top portion of the first well portion 104 has sloped sidewalls, and the exposed top portion of the second well portion 106 has sloped sidewalls.

The top surface of the liner layer 130 is level with the top surface of the isolation structure 150. In some other embodiments, the top surface of the liner layer 130 is higher than the top surface of the isolation structure 150.

The liner layer 130 is used to protect the first fin structure 11 and the second fin structure 12 from being damaged by the subsequent processes. During the annealing process 50 in FIG. 1H, the liner layer 130 is formed on the first material layer 110 and the second material layer 120 to protect the first material layer 110 and the second material layer 120 from being oxidized. If no liner layer 130 formed on the first material layer 110 and the second material layer 120, the first material layer 110 and the second material layer 120 may be easily oxidized at high temperature.

Furthermore, during the etching process 60 shown in FIG. 1J, a portion of the liner layer 130 is removed. When the liner layer 130 is made of robust material, the liner layer 130 is not easy to remove, but effectively to protect the first material layer 110 and the second material layer 120. Therefore, the rigid liner layer 130 is used to prevent the underlying first material layer 110 and the second material layer 120 from being oxidized and etched. In contrast, if the liner layer 130 is easy to remove, the first material layer 110 and the second material layer 120 will be removed unevenly due to lack of protection. As a result, the profiles or shapes of the fin structures 11, 12 may be wiggled or bent.

In some embodiments, there is a first distance $D_1$ between the first interface 105 and the top surface of the isolation structure 150 in the first region 10. In some embodiments, there is a second distance $D_2$ between the second interface 115 and the top surface of the isolation structure 150 in the second region 20. In some embodiments, the first distance $D_1$ is in a range from about 1 nm to about 5 nm. In some embodiments, the second distance $D_2$ is in a range from about 1 nm to about 5 nm. If the distance $D_1$, $D_2$ is smaller than 1 nm, the fin structures 11, 12 may be oxidized or nitride, and thus the profile of the fin structures 11, 12 may not be preserved. If the distance is greater than 5 nm, the gate control ability to the channel region is decreased, and thus the performance of the FinFET device structure is deteriorated. Since the liner layer 130 is used to protect the first material layer 110 of the first fin structure 11 and the second material layer 120 of the second fin structure 12, the profile and shape of the fin structure 11 and the second fin structure 12 are maintained, not destroyed by the etching process 60. Therefore, the line edge roughness (LER) of the fin structure 11 and that of the second fin structure 12 may be small. In some embodiments, the first material layer 110 has a line edge roughness (LER) in a range from about 1 nm to about 3 nm. In some embodiments, the second material layer 120 has a line edge roughness (LER) in a range from about 1 nm to about 3 nm.

Figure 1K:
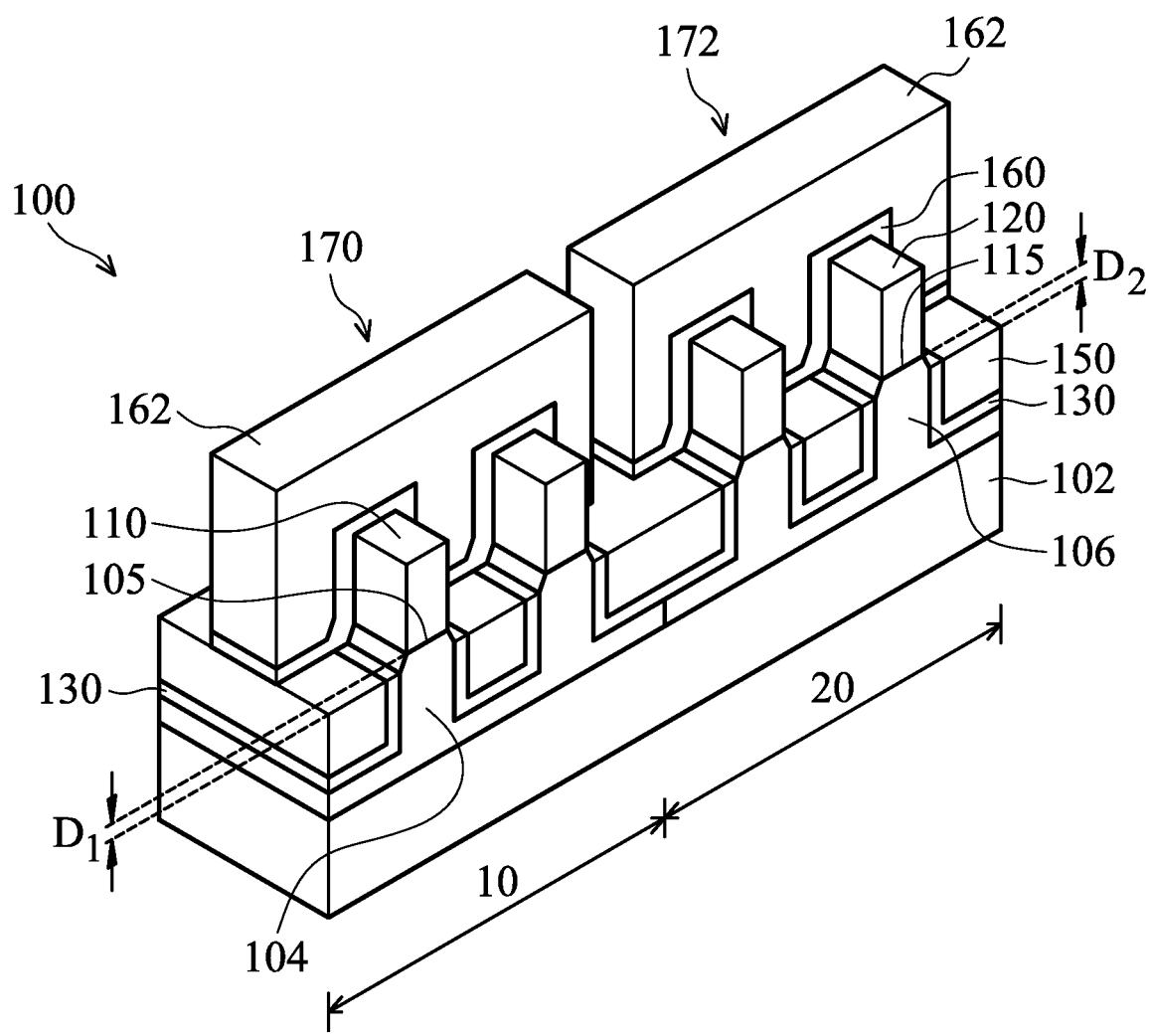

Afterwards, a dummy gate dielectric layer 160 and a dummy gate electrode layer 162 are formed on the isolation structure 150 and the liner layer 130 as shown in FIG. 1K, in accordance with some embodiments. As a result, a first dummy gate structure 170 is formed on the middle portion of the first fin structure 11 in the first region 10, and a second dummy gate structure 172 is formed on the middle portion of the second fin structure 12 in the second region 20. The middle portion of the first fin structure 11 which is surrounded or wrapped by the first dummy gate structure 170 is the channel region. The middle portion of the second fin structure 12 which is surrounded or wrapped by the second dummy gate structure 172 is the channel region. The dummy gate dielectric layer 160 is formed between the liner layer 130 and the dummy gate electrode layer 162.

In some embodiments, the dummy gate dielectric layer 160 is made of dielectric materials, such as silicon oxide, silicon nitride, silicon oxynitride, dielectric material with high dielectric constant (high-k), or combinations thereof. The dummy gate dielectric layer 160 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the dummy gate electrode layer 162 is made of conductive or non-conductive materials. In some embodiments, the dummy gate electrode layer 162 is made of polysilicon. The dummy gate electrode layer 162 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, a portion of the first material layer 110 adjacent to the first dummy gate structure 170 is removed to form a recess (not shown), and a source/drain (S/D) structure is formed in the recess. A portion of the second material 120 adjacent to the second dummy gate structure 172 is removed to form a recess (not shown), and a source/drain (S/D) structure is formed in the recess.

In some embodiments, the source/drain structures include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

Afterwards, the ILD structure is formed on the first dummy gate structure 170, the second dummy gate structure 172 and the source/drain structures. Next, the first dummy gate structure 170, the second dummy gate structure 172 are removed to form a trench, and a gate dielectric layer and gate electrode layer are formed in the trench. In some embodiments, a p-type FinFET (PMOS device) is formed in the first region 10, and a n-type FinFET (NMOS device) is formed in the second region 20.

Figure 2A:
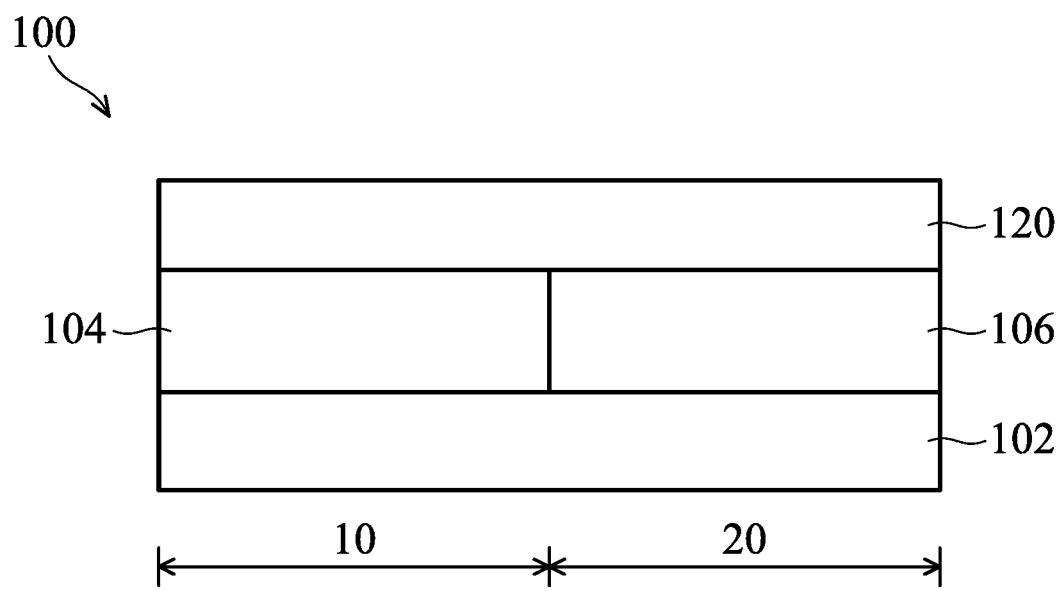
FIGS. 2A-2K show cross-sectional representations of forming a fin field effect transistor (FinFET) device structure, in accordance with some embodiments of the disclosure.

FIGS. 2A-2K show cross-sectional representations of forming a fin field effect transistor (FinFET) device structure 100, in accordance with some embodiments of the disclosure. FIG. 2A is cross-sectional representation taken along I-I' line of FIG. 1A.

A shown in FIG. 2A, the first well portion 104 and the second well portion 106 are formed on the substrate 102, and the second material layer 120 is formed on the first well portion 104 and the second well portion 106.

Figure 2B:
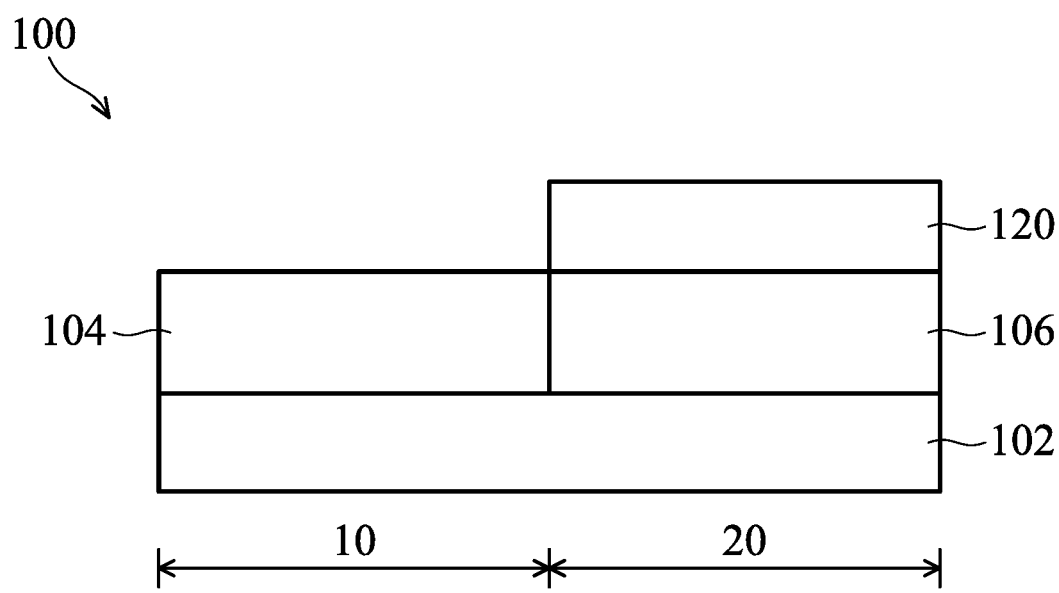

Afterwards, a portion of the second material layer 120 is removed to expose the first well portion 104, as shown in FIG. 2B, in accordance with some embodiments of the disclosure.

Figure 2C:
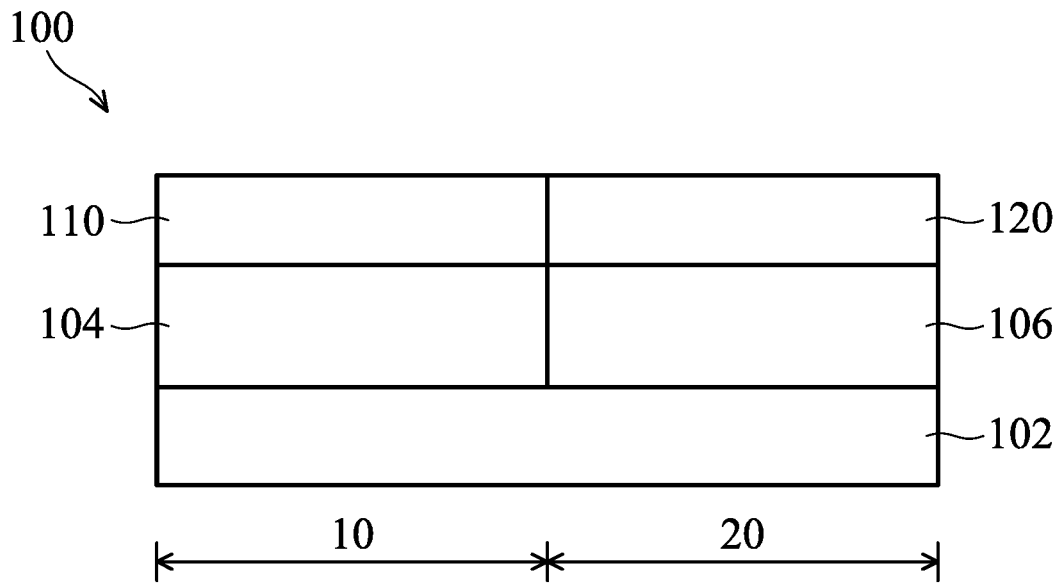

Afterwards, the first material layer 110 is formed on the first well portion 104 in the first region, as shown in FIG. 2C, in accordance with some embodiments of the disclosure.

Figure 2D:
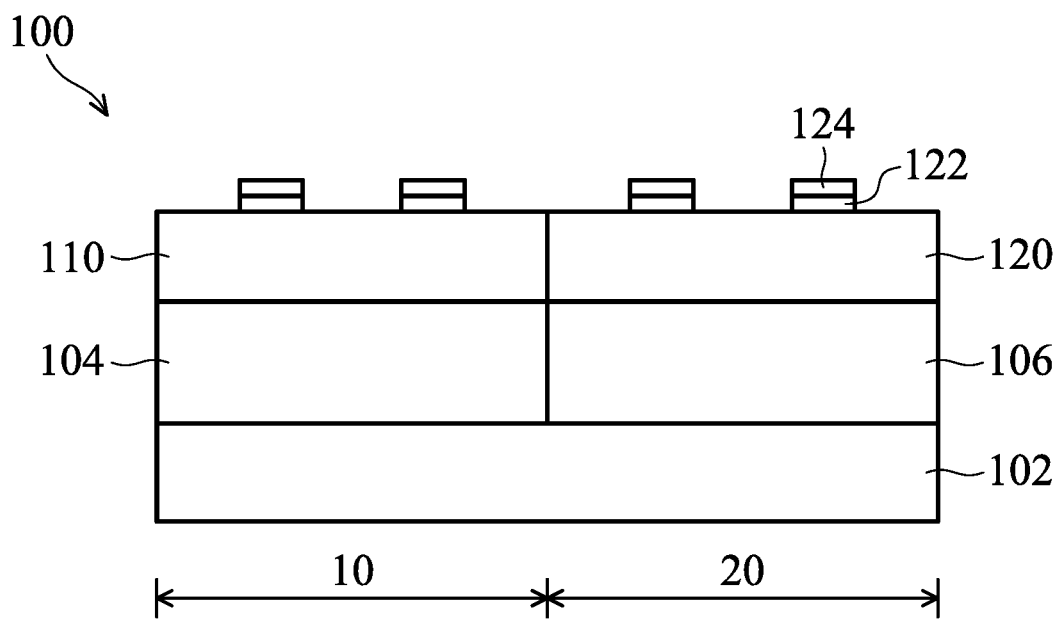

Afterwards, the oxide layer 122 is formed on the first material 110 and the second material 120, and the hard mask layer 124 is formed on the oxide layer 122, as shown in FIG. 2D, in accordance with some embodiments of the disclosure. Afterwards, the oxide layer 122 and the hard mask layer 124 are patterned to form the patterned oxide layer 122 and the patterned hard mask layer 124.

Figure 2E:
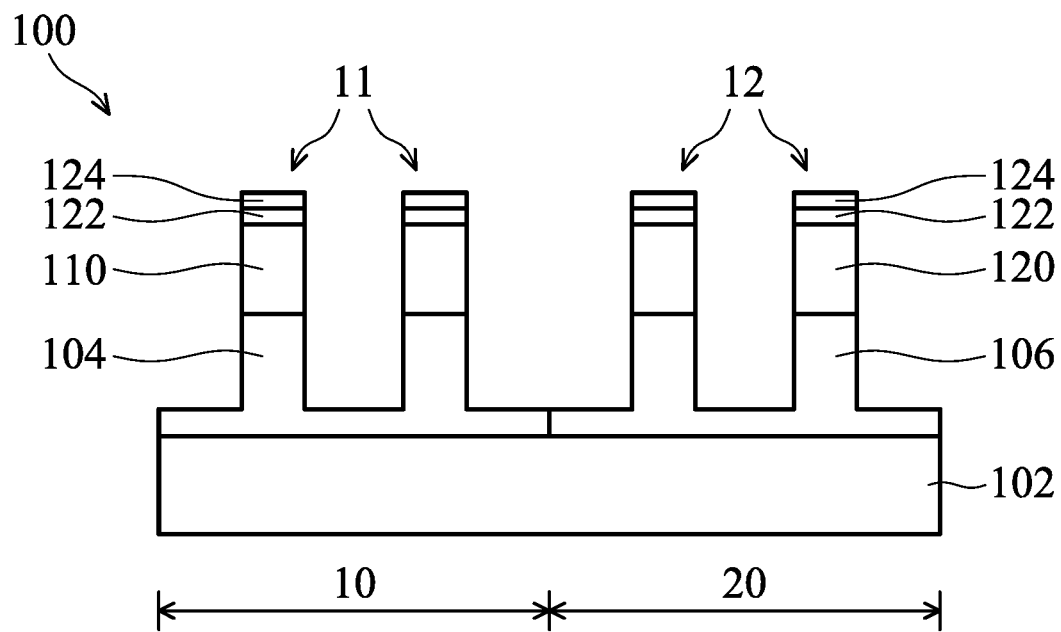

Afterwards, a portion of the first material layer 110, a portion of the first well portion 104, a portion of the second material layer 120, and a portion of the second well portion 106 are removed, as shown in FIG. 2E, in accordance with some embodiments of the disclosure. As a result, the first structure 11 includes the first well portion 104 and the first material layer 110 and the second fin structure 12 includes the second well portion 106 and the second material layer 120.

Figure 2F:
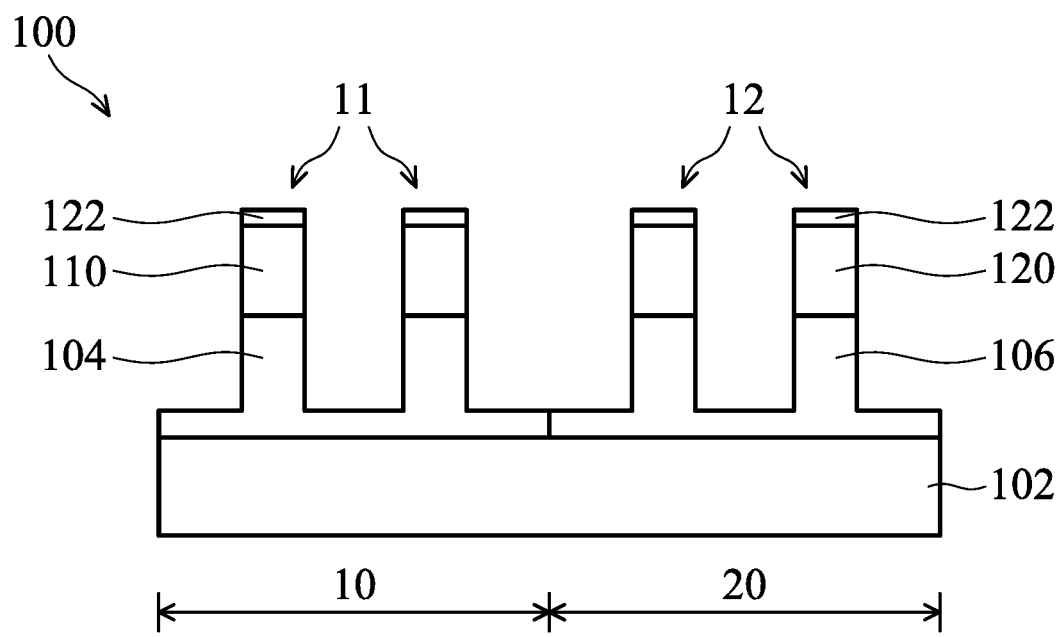

Afterwards, the hard mask layer 124 is removed to expose the oxide layer 122, as shown in FIG. 2F, in accordance with some embodiments of the disclosure. In some embodiments, the hard mask layer 124 is removed by an etching process, such as dry etching process or wet etching process.

Figure 2G:
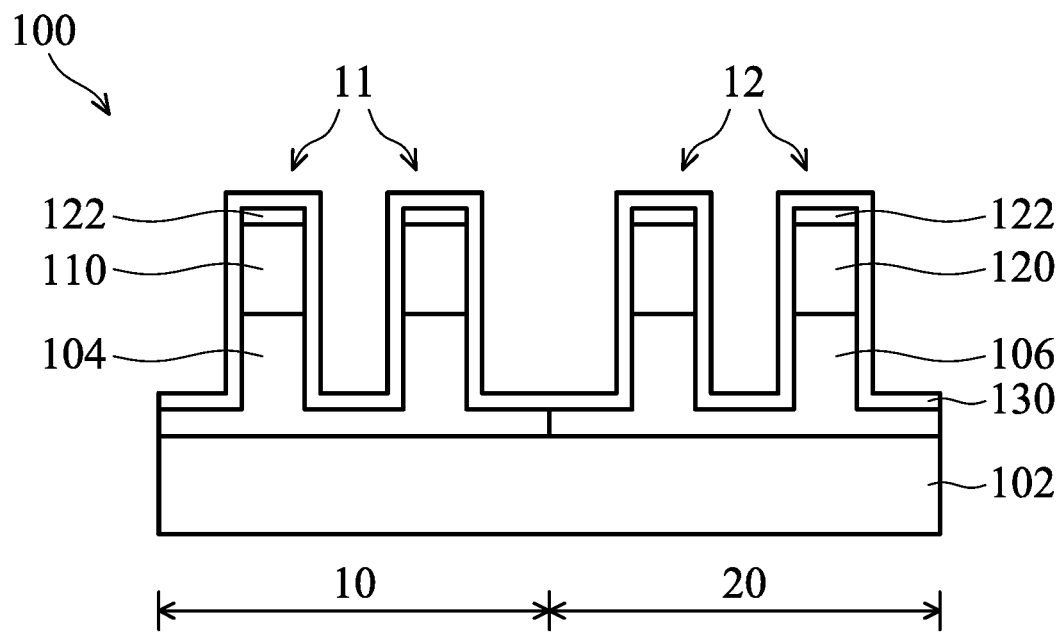

After the hard mask layer 124 is removed, the liner layer 130 is formed on the first structure 11 and the second fin structure 12, the first well portion 104 and the second well portion 106 as shown in FIG. 2G, in accordance with some embodiments of the disclosure. The liner layer 130 is conformally formed on the sidewalls and top surface of the first material layer 110, the sidewalls of the first well portion 104, the sidewalls and top surface of the second material layer 120, and sidewalls of the second well portion 106. The liner layer 130 is robust to protect the first fin structure 11 and the second fin structure 12 from being damaged by the subsequent processes.

In order to effectively protect the area underlying the first fin structure 11 and the second fin structure 12, the liner layer 130 should be robust or rigid. When the Young's modulus of the liner layer 130 is in a range from about 200 GPa to about 1000 GPa, the liner layer 130 is robust or rigid enough to protect the underlying structures. The liner layer 130 is made of nitrogen-containing material, carbon-containing material or combinations thereof.

Figure 2H:
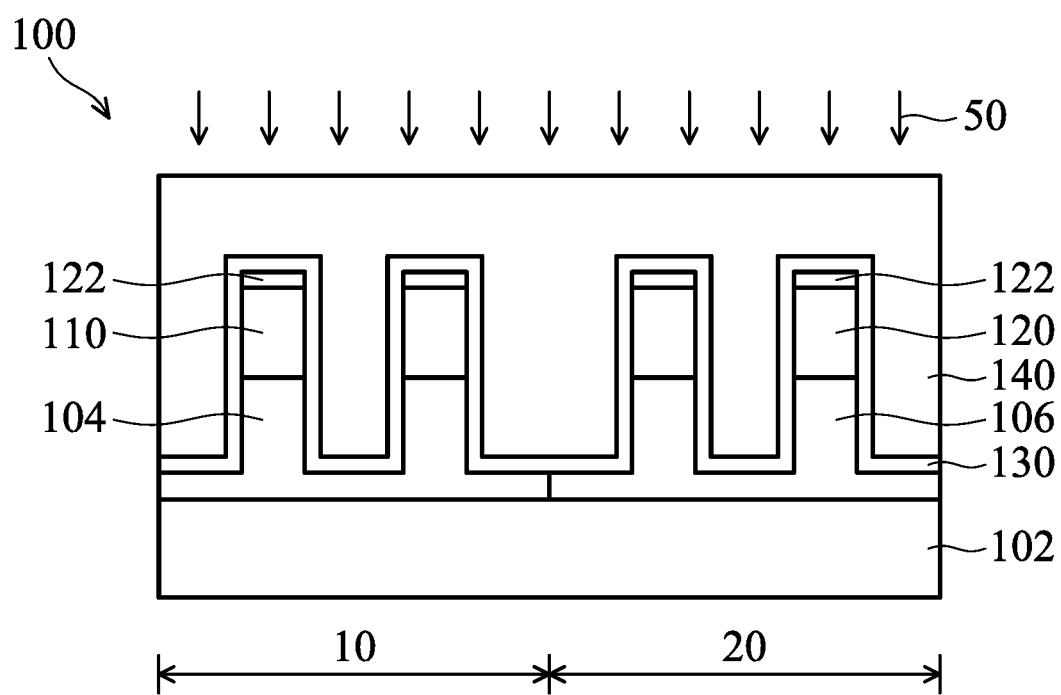

After the liner layer 130 is formed, the dielectric layer 140 is formed on the liner layer 130, as shown in FIG. 2H, in accordance with some embodiments. In some embodiments, a dielectric material is deposited on the first fin structure 11, the second fin structure 12 and the liner layer 130, and afterwards an anneal process 50 is performed on the dielectric material. During the anneal process 50, the dielectric material is transformed from liquid form into solid form to form the dielectric layer 140.

Figure 2I:
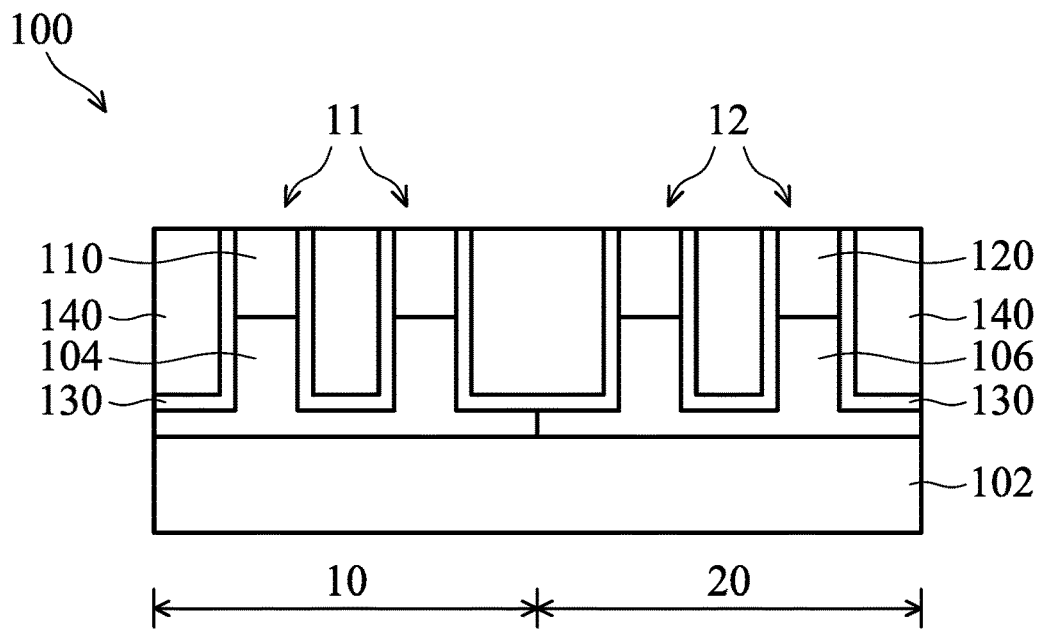

After the dielectric layer 140 is formed, the dielectric layer 140 is thinned or planarized until a top surface of the dielectric layer 140 is level with the top surface of the first material layer 110 and the top surface of the second material layer 120 as shown in FIG. 2I, in accordance with some embodiments. In addition, the oxide layer 122 is removed. In some embodiments, the dielectric layer 208 is thinned by a chemical mechanical polishing (CMP) process.

Figure 2J:
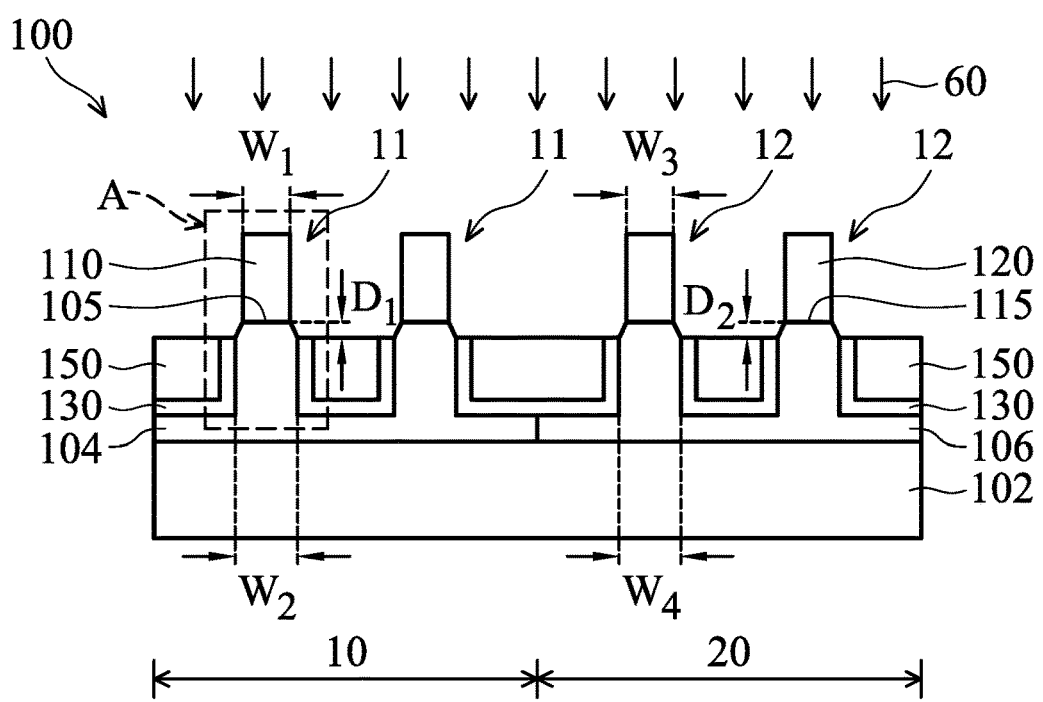
Figure 2K:
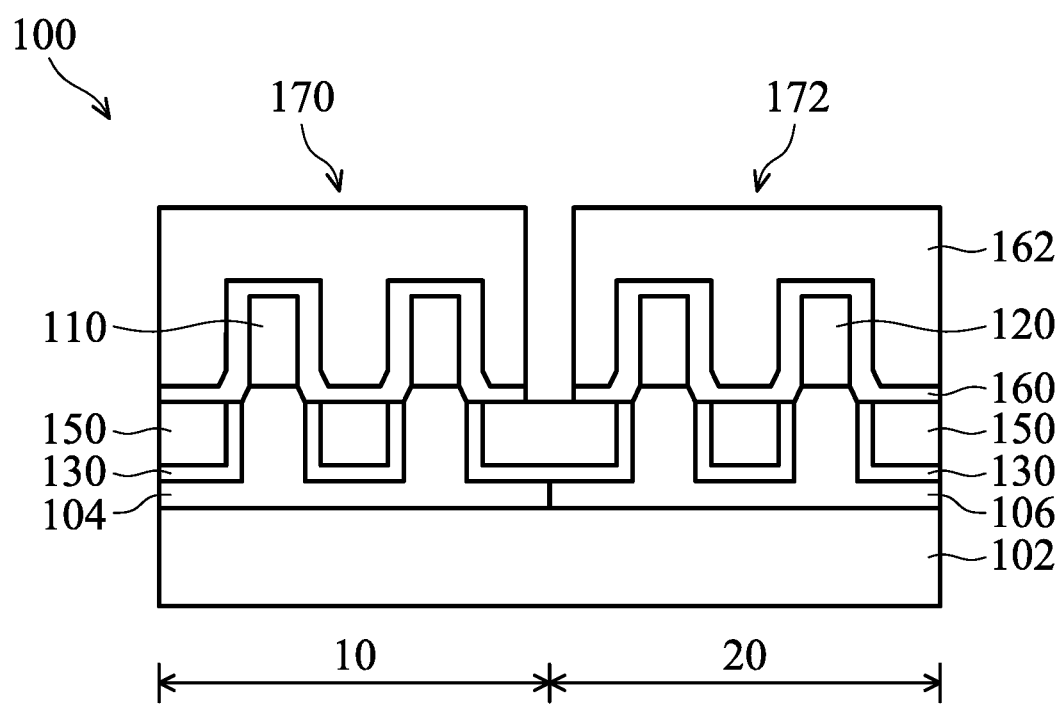

Afterwards, a portion of the dielectric layer 140, a portion of the liner layer 130 are removed to expose the first material layer 110 in the first region 10 and the second material layer 120 in the second region 20 as shown in FIG. 2J, in accordance with some embodiments. As a result, the isolation structure 150 is formed. The dielectric layer 140 is removed by an etching process 60, such as a dry etching process or a wet etching process.

The first interface 105 is higher than the top surface of the isolation structure 150, and the second interface 115 is higher than the top surface of the isolation structure 150.

The liner layer 130 is formed on sidewalls of the first well portion 104 and the sidewalls of the second well portion 106. The liner layer 130 is extended from the sidewalls of the first well portion 104 to the sidewalls of the second well portion 106. Therefore, the isolation structure 150 is surrounded by the liner layer 130.

Figure 3:
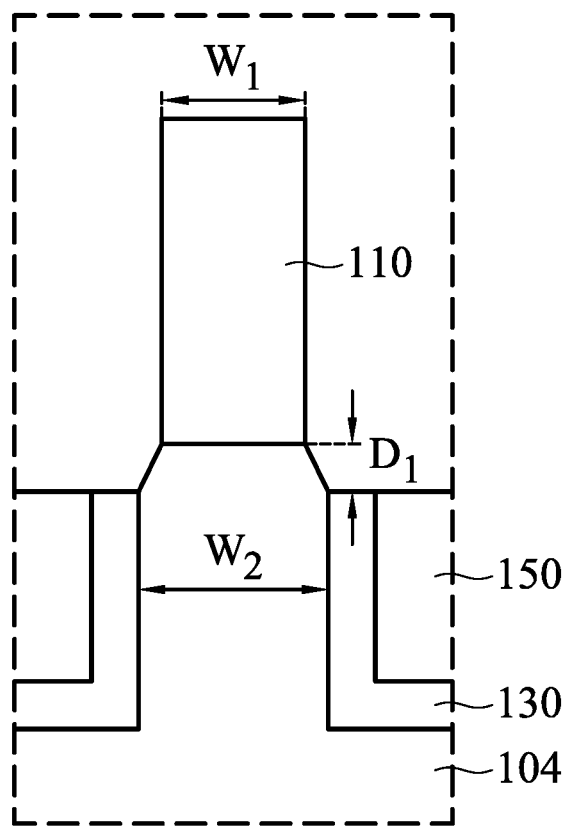
FIG. 3 is an enlarged representation of region A of FIG. 2J.

FIG. 3 is an enlarged representation of region A of FIG. 2J. In some embodiments, the first material layer 110 is slightly removed by the etching process 60, and therefore the width $W_1$ of the first material layer 110 is smaller than the width $W_2$ of the first well portion 104. In some embodiments, the second material layer 120 is slightly removed by the etching process 60, and therefore the width $W_3$ of the second material layer 120 is smaller than the width $W_4$ of the second well portion 106.

In addition, a portion of the top portion of the first well portion 104 is slightly removed, and a portion of the top portion of the second well portion 106 is removed. Therefore, in the first region 10, the first well portion 104 above the top surface of the isolation structure 150 has a width that gradually increases from the upper portion to the bottom portion. In the second region 20, the second well portion 106 above the top surface of the isolation structure 150 has a width that gradually increases from the upper portion to the bottom portion. In other words, the exposed the first well portion 104 has sloped sidewalls, and the exposed second well portion 106 has sloped sidewalls.

Afterwards, the dummy gate dielectric layer 160 and the dummy gate electrode layer 162 are formed on the isolation structure 150, the liner layer 130, the first fin structure 11 and the second fin structure 12, as shown in FIG. 1K, in accordance with some embodiments. As a result, the first dummy gate structure 170 is formed on the middle portion of the first fin structure 11 in the first region 10, and the second dummy gate structure 172 is formed on the middle portion of the second fin structure 12 in the second region 20. The dummy gate structure 170, 172 will be replaced by a gate structure having high-k dielectric layer and metal gate electrode layer.

In the first region 10, a first material layer 110 is made of silicon germanium (SiGe), and the liner layer 130 is made of silicon nitride (SixNy) to protect the silicon germanium (SiGe) from being oxidized. In some embodiments, the liner layer 130 is not made of oxide, such as silicon oxide. If the liner layer 130 made of silicon oxide, the liner layer 130 is not robust enough to protect the silicon germanium (SiGe). If a portion of the silicon germanium (SiGe) is oxidized, the germanium (Ge) concentration will be reduced and the FinFET structure cannot provide enough stress. Therefore, the electrical characteristics of FinFET structure in the first region 10 may be degraded.

Figure 4A:
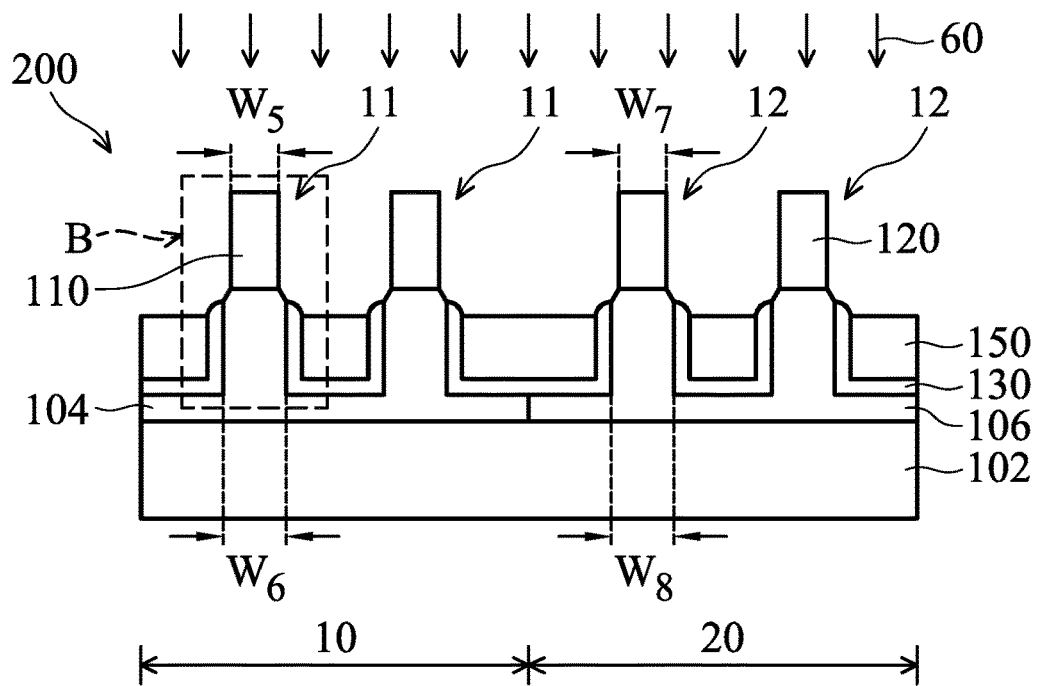
FIGS. 4A-4B show cross-sectional representations of forming a fin field effect transistor (FinFET) device structure, in accordance with some embodiments of the disclosure.
Figure 4B:
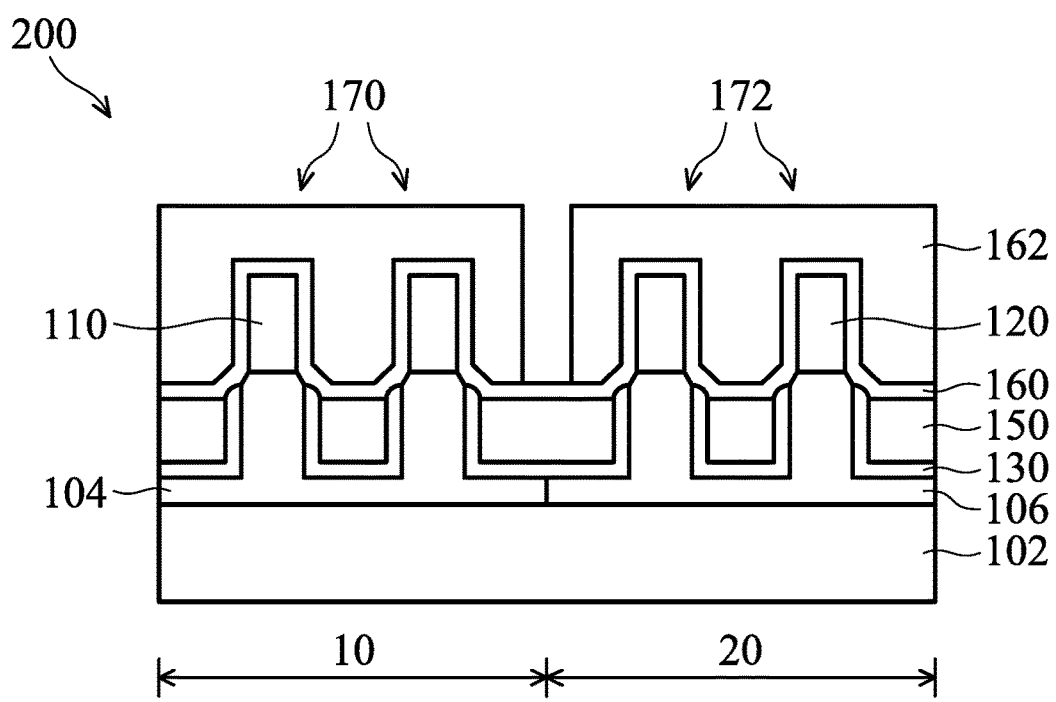
Figure 5:
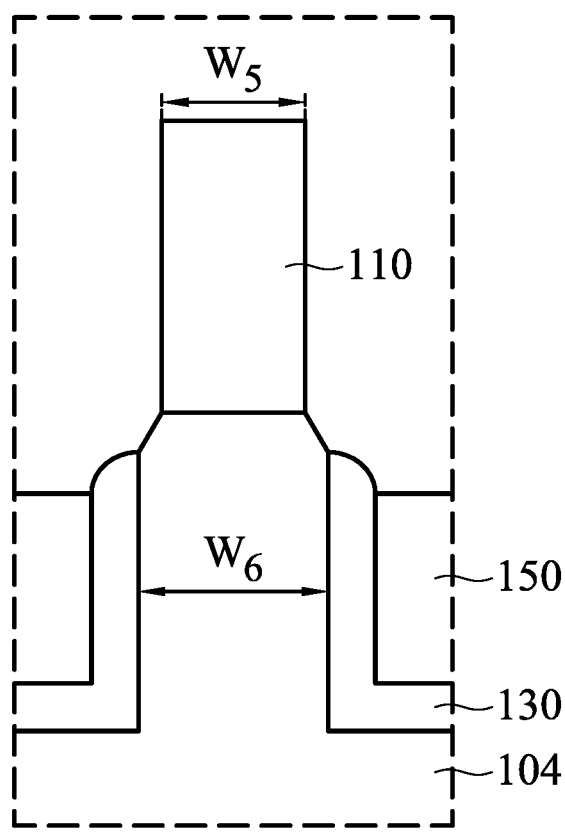
FIG. 5 is an enlarged representation of region A of FIG. 4A.

FIGS. 4A-4B show cross-sectional representations of forming a fin field effect transistor (FinFET) device structure 200, in accordance with some embodiments of the disclosure. FIG. 5 is an enlarged representation of region B of FIG. 4A.

The structure of FIG. 4A is similar to the structure of FIG. 2J, the difference is that the liner layer 130 protrudes from the top surface of the isolation structure 150 in FIG. 4A. As shown in FIG. 4A and FIG. 5, the top surface of the liner layer 130 is not parallel to the top surface of the isolation structure 150. The liner layer 130 above the top surface of the isolation structure 150 has sloped sidewalls. In some embodiments, the liner layer 130 above the top surface of the isolation structure 150 has a width that gradually increases from an upper portion to a bottom portion of the liner layer 130.

In some embodiments, the first material layer 110 is slightly removed by the etching process 60, and therefore the width $W_5$ of the first material layer 110 is smaller than the width $W_6$ of the first well portion 104. In some embodiments, the second material layer 120 is slightly removed by the etching process, and therefore the width $W_7$ of the second material layer 120 is smaller than the width $W_8$ of the second well portion 106.

Afterwards, the dummy gate dielectric layer 160 and the dummy gate electrode layer 162 are formed on the isolation structure 150, the liner layer 130, the first fin structure 11 and the second fin structure 12, as shown in FIG. 4B, in accordance with some embodiments. As a result, the first dummy gate structure 170 is formed on the middle portion of the first fin structure 11 in the first region 10, and the second dummy gate structure 172 is formed on the middle portion of the second fin structure 12 in the second region 20. The dummy gate dielectric layer 160 is between the liner layer 130 and the dummy gate electrode layer 162. The dummy gate structure 170, 172 will be replaced by high-k dielectric layer and metal gate electrode layer.

The dummy gate dielectric layer 160 is conformally formed on the first fin structure 11 and the second fin structure 12. Therefore, the dummy gate dielectric layer 160 has sloped portion on the sloped sidewall of the liner layer 130.

The liner layer 130 is made of material having a Young's modulus in a range from about 200 GPa to about 1000 GPa. Therefore, the liner layer 130 is robust enough to protect the underlying structures, such as the first material layer 110 and the second material layer 130 from being damaged. During the annealing process 50 (shown in FIGS. 1H and 2H), the first material layer 110 and the second material layer 130 do not easily oxidize due to the protection of the liner layer 130. During the etching process 60 (shown in FIGS. 1J, 2J and 4A), the first material layer 110 and the second material layer 130 are not easy to etch due to the protection of the liner layer 130.

Embodiments for forming a fin field effect transistor (FinFET) device structure are provided. A fin structure is extended from a substrate, and the fin structure includes a channel region and a bottom region below the channel region. A liner layer is used to protect the channel region from being damaged. The liner layer is made of robust material having a high Young's modulus. In some embodiments, the channel region is made of silicon germanium (SiGe), and the liner layer is made of silicon nitride. The shapes and profiles of the channel region are maintained without damage being caused by the etching process due to the protection of the liner layer. Therefore, the performance of the fin field effect transistor (FinFET) device structure is improved.

In some embodiments, a fin field effect transistor (FinFET) device structure is provided. The FinFET device structure includes a fin structure extending above a substrate, and the fin structure has a first portion and a second portion below the first portion, and the first portion and the second portion are made of different materials. The FinFET device structure includes an isolation structure formed on the substrate, and an interface between the first portion and the second portion of the fin structure is above a top surface of the isolation structure. The FinFET device structure includes a liner layer formed on sidewalls of the second portion of the fin structure.

In some embodiments, a fin field effect transistor (FinFET) device structure is provided. The FinFET device includes a first fin structure extending above a substrate, and the first fin structure has a channel region and a bottom region below the channel region. The FinFET device includes a liner layer formed on sidewalls of the bottom region of the first fin structure. The FinFET device includes a gate dielectric layer formed on the channel region of the fin structure; and a gate structure formed on the gate dielectric layer, and the gate dielectric layer is between the liner layer and the gate electrode layer.

In some embodiments, a fin field effect transistor (FinFET) device structure is provided. The FinFET device includes a substrate, and the substrate comprises a first region and a second region. The FinFET device includes a first fin structure formed on the first region of the substrate, and a top portion of the first fin structure is made of silicon germanium (SiGe). The FinFET device includes a second fin structure formed on the second region of the substrate, and a top portion of the second fin structure is made of silicon (Si). The FinFET device includes a liner layer formed on sidewalls of a bottom portion of the first fin structure and sidewalls of a bottom portion of the second fin structure. The liner layer is extended from the sidewalls of the first fin structure to the sidewalls of the second fin structure, and the liner layer has a sloped top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a fin structure extending above a substrate, wherein the fin structure has a first portion and a second portion below the first portion, the first portion and the second portion are made of different materials, and the second portion is a N-well portion;
    an isolation structure formed on the substrate, wherein an interface between the first portion and the second portion of the fin structure is above a top surface of the isolation structure;
    a liner layer formed on sidewalls of the second portion of the fin structure, wherein the liner layer is made of carbon-containing material, and the liner layer is spaced apart from the interface by a first distance;
    a gate dielectric layer formed on sidewalls of the first portion of the fin structure and on a top portion of the sidewalls of the second portion of the fin structure, wherein the top portion of the sidewalls of the second portion of the fin structure is not covered by the liner layer; and
    a gate electrode layer formed on the gate dielectric layer, wherein an aspect of cross-sectional view profile along the direction of the gate electrode layer comprises a portion of the fin structure between a first portion of the isolation structure and a second portion of the isolation structure, and the gate dielectric layer extends along the entire top surface of the first portion and the second portion of the isolation structure and is in contact with the top portion of the sidewalls of the second portion of the fin structure that is not covered by the liner layer, wherein a top surface of the liner layer is lower than the interface and higher than a top surface of the isolation structure.

2. The fin field effect transistor (FinFET) device structure as claimed in claim 1, wherein the liner layer has a Young's modulus in a range from about 200 GPa to about 1000 GPa.

3. The fin field effect transistor (FinFET) device structure as claimed in claim 1, wherein the liner layer is made of silicon carbide (SiC), silicon oxycarbide (SiOC) or combinations thereof.

4. The fin field effect transistor (FinFET) device structure as claimed in claim 1, wherein the first portion of the fin structure is made of silicon germanium (SiGe), and the second portion of the fin structure is made of n-typed doped silicon (Si).

5. The fin field effect transistor (FinFET) device structure as claimed in claim 1, wherein the liner layer is not made of silicon oxide.

6. The fin field effect transistor (FinFET) device structure as claimed in claim 1, wherein
    the gate dielectric layer on the top portion of the sidewalls of the second portion of the fin structure is in contact with the liner layer on the sidewalls of the second portion of the fin structure;
    the gate dielectric layer is between the liner layer and the gate electrode layer; and
    the gate electrode layer extends along the entire top surface of the first portion and the second portion of the isolation structure.

7. The fin field effect transistor (FinFET) device structure as claimed in claim 1, wherein a topmost contact point between the liner layer and the N-well portion is below the interface.

8. The fin field effect transistor (FinFET) device structure as claimed in claim 1, wherein a first width of the first portion of the fin structure is smaller than a second width of the second portion of the fin structure.

9. A fin field effect transistor (FinFET) device structure, comprising:
    a first fin structure extending above a substrate, wherein the first fin structure has a channel region and a bottom region below the channel region, and the channel region and the bottom region of the first fin structure are made of different materials;
    an isolation structure formed on the substrate, wherein an interface between the channel region and the bottom region of the first fin structure is above a top surface of the isolation structure;
    a liner layer formed on sidewalls of the bottom region of the first fin structure, wherein the liner layer is made of silicon nitride, silicon carbide (SiC), silicon oxynitride (SiON), silicon oxycarbide (SiOC) or combinations thereof, and the liner layer has a dielectric constant in a range from 0 to 10;
    a gate dielectric layer formed on sidewalls of the channel region of the first fin structure and on a top portion of the sidewalls of the bottom region of the fin structure, wherein the gate dielectric layer on the top portion of the sidewalls of the bottom region of the first fin structure is in contact with the liner layer on the sidewalls of the bottom region of the first fin structure, wherein the top portion of the sidewalls of the bottom region of the fin structure is not covered by the liner layer, and wherein a bottommost surface of the gate dielectric layer is lower than a topmost portion of the liner layer; and
    a gate electrode layer formed on the gate dielectric layer, wherein the gate dielectric layer is between the liner layer and the gate electrode layer,
    wherein an aspect of cross-sectional view profile along the direction of the gate electrode layer comprises a portion of the fin structure between a first portion of the isolation structure and a second portion of the isolation structure, and the gate dielectric layer extends along the entire top surface of the first portion and the second portion of the isolation structure and is in contact with the top portion of the sidewalls of the bottom region of the fin structure that is not covered by the liner layer, wherein a top surface of the liner layer is lower than the interface and higher than a top surface of the isolation structure.

10. The fin field effect transistor (FinFET) device structure as claimed in claim 9, further comprising:
a second fin structure formed adjacent to the first fin structure, wherein the liner layer is extended from the sidewalls of the bottom region of the first fin structure to sidewalls of a bottom region of the second fin structure.

11. The fin field effect transistor (FinFET) device structure as claimed in claim 9, wherein the channel region of the first fin structure is made of silicon germanium (SiGe), and the bottom region of the first fin structure is made of silicon (Si).

12. The fin field effect transistor (FinFET) device structure as claimed in claim 9, wherein a first width of the channel region of the first fin structure is smaller than a second width of the bottom region of the fin structure.

13. The fin field effect transistor (FinFET) device structure as claimed in claim 9,
wherein a lateral extending portion of the gate dielectric layer extends directly from a portion of the gate dielectric layer that is in contact with a top surface of the liner layer.

14. The fin field effect transistor (FinFET) device structure as claimed in claim 13, wherein the liner layer above the top surface of the isolation structure has a width that gradually increases from an upper portion to a bottom portion of the liner layer.

15. A fin field effect transistor (FinFET) device structure, comprising:
a substrate, wherein the substrate comprises a first region and a second region;
a first fin structure formed on the first region of the substrate, wherein a top portion of the first fin structure is made of silicon germanium (SiGe), and the top portion and a bottom portion of the first fin structure are made of different materials, and a first interface is between the top portion and the bottom portion of the first fin structure;
a second fin structure formed on the second region of the substrate, wherein a top portion of the second fin structure is made of silicon (Si);
an isolation structure formed on the substrate and formed between the first fin structure and the second fin structure;
a liner layer formed on sidewalls of the bottom portion of the first fin structure and sidewalls of a bottom portion of the second fin structure, wherein the liner layer is extended from the sidewalls of the first fin structure to the sidewalls of the second fin structure, the liner layer has a sloped top surface, and the liner layer has a Young's modulus in a range from about 200 GPa to about 1000 GPa;
a gate dielectric layer formed on sidewalls of the top portion of the first fin structure and on a top portion of the sidewalls of the bottom portion of the first fin structure, wherein the top portion of the sidewalls of the bottom portion of the first fin structure is not covered by the liner layer; and
a gate electrode layer formed on the gate dielectric layer, wherein an aspect of cross-sectional view profile along the direction of the gate electrode layer comprises a portion of the fin structure between a first portion of the isolation structure and a second portion of the isolation structure, and the gate dielectric layer extends along the entire top surface of the first portion and the second portion of the isolation structure and is in contact with the top portion of the sidewalls of the bottom portion of the first fin structure that is not covered by the liner layer,
wherein a top surface of the liner layer is lower than the first interface and higher than a top surface of the isolation structure.

16. The fin field effect transistor (FinFET) device structure as claimed in claim 15, wherein
the gate dielectric layer on the top portion of the sidewalls of the bottom portion of the first fin structure is in contact with the liner layer on the sidewalls of the bottom portion of the first fin structure; and
the gate dielectric layer is between the liner layer and the gate electrode layer.

17. The fin field effect transistor (FinFET) device structure as claimed in claim 15, wherein the liner layer is sloped to the bottom portion of the first fin structure.

18. The fin field effect transistor (FinFET) device structure as claimed in claim 15, wherein a second interface is between the top portion made of silicon and the bottom portion of the second fin structure, the liner layer is spaced apart from the first interface by a first distance, and the liner layer is spaced apart from the second interface by a second distance.

19. The fin field effect transistor (FinFET) device structure as claimed in claim 15, wherein the first region of the substrate is a PMOS device region, and the liner layer is spaced apart from an interface between the top portion and the bottom portion of the first fin structure by a first distance.

20. The fin field effect transistor (FinFET) device structure as claimed in claim 19, wherein the second region of the substrate is a NMOS device region, and the liner layer is spaced apart from an interface between the top portion and the bottom portion of the second fin structure by a second distance.

* * * * *